United States Patent
Okada

(10) Patent No.: US 9,136,190 B2
(45) Date of Patent: Sep. 15, 2015

(54) SEMICONDUCTOR MANUFACTURING PROCESS SYSTEM AND METHOD

(71) Applicant: KABUSHIKI KAISHA TOSHIBA, Tokyo (JP)

(72) Inventor: Eiichi Okada, Mie (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 375 days.

(21) Appl. No.: 13/795,760

(22) Filed: Mar. 12, 2013

(65) Prior Publication Data

US 2014/0065732 A1    Mar. 6, 2014

(30) Foreign Application Priority Data

Aug. 29, 2012  (JP) ................................. 2012-189193

(51) Int. Cl.
*H01L 21/66* (2006.01)
*B24B 37/04* (2012.01)
*G05B 19/418* (2006.01)
*B24B 37/34* (2012.01)

(52) U.S. Cl.
CPC .............. *H01L 22/20* (2013.01); *B24B 37/042* (2013.01); *B24B 37/34* (2013.01); *G05B 19/41865* (2013.01); *G05B 2219/32234* (2013.01); *G05B 2219/32235* (2013.01); *G05B 2219/32269* (2013.01); *G05B 2219/32286* (2013.01); *G05B 2219/45031* (2013.01)

(58) Field of Classification Search
CPC .. H01L 22/20; B24B 37/34; G05B 19/41865; G05B 2219/32234; G05B 2219/45031; G05B 2219/32286; G05B 2219/32269; G05B 2219/32235

USPC ........ 700/95, 108, 109, 112, 121; 702/81, 84; 438/8; 156/345.13

See application file for complete search history.

(56) References Cited

U.S. PATENT DOCUMENTS

| | | | |
|---|---|---|---|
| 6,354,922 B1* | 3/2002 | Sakurai et al. | 451/67 |
| 6,358,128 B1* | 3/2002 | Sakurai et al. | 451/67 |
| 6,444,974 B1* | 9/2002 | Kojima | 250/222.1 |
| 6,682,408 B2* | 1/2004 | Sakurai et al. | 451/67 |
| 6,878,044 B2* | 4/2005 | Sakurai et al. | 451/67 |
| 7,113,838 B2* | 9/2006 | Funk et al. | 700/108 |

(Continued)

FOREIGN PATENT DOCUMENTS

| | | | |
|---|---|---|---|
| JP | 2000-150608 A | 5/2000 | |
| JP | 2005-182112 A | 7/2005 | |

(Continued)

OTHER PUBLICATIONS

Office Action mailed Dec. 16, 2014 issued in corresponding JP patent application No. 2012-189193 (and English translation).

*Primary Examiner* — Charles Kasenge
(74) *Attorney, Agent, or Firm* — Posz Law Group, PLC

(57) ABSTRACT

According to one embodiment, a wafer processing device includes a processed number counting unit that counts a number of processed wafers, and a maintenance post-processing unit that executes a dummy lot process and a QC lot process after a maintenance process. A wafer preparation device prepares the dummy lot and the QC lot, when a first processed number is counted by the processed number counting unit. When a second processed number is counted by the processed number counting unit, a carrier device carries the dummy lot and the QC lot to the wafer processing device simultaneously with the maintenance process, before the maintenance process is completed.

20 Claims, 20 Drawing Sheets

(56) References Cited

U.S. PATENT DOCUMENTS

| | | | |
|---|---|---|---|
| 7,123,980 B2 * | 10/2006 | Funk et al. | 700/121 |
| 7,349,750 B2 * | 3/2008 | Nishinohara et al. | 700/95 |
| 7,463,941 B2 * | 12/2008 | Ogawa et al. | 700/109 |
| 7,584,011 B2 * | 9/2009 | Nishinohara et al. | 700/95 |
| 7,632,378 B2 * | 12/2009 | Sakurai et al. | 156/345.31 |

FOREIGN PATENT DOCUMENTS

| | | |
|---|---|---|
| JP | 2006-228779 A | 8/2006 |
| JP | 2006-293433 A | 10/2006 |

* cited by examiner

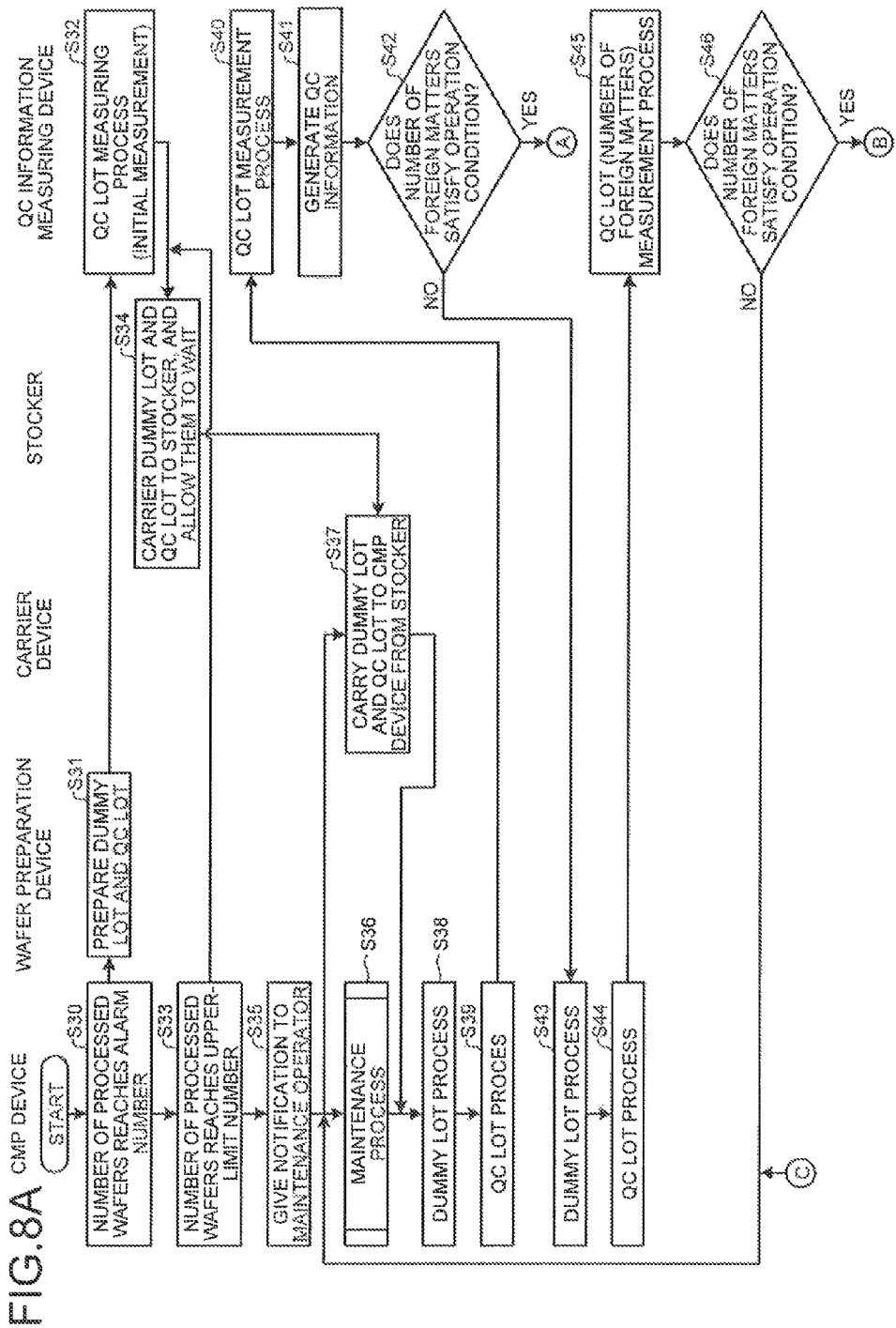

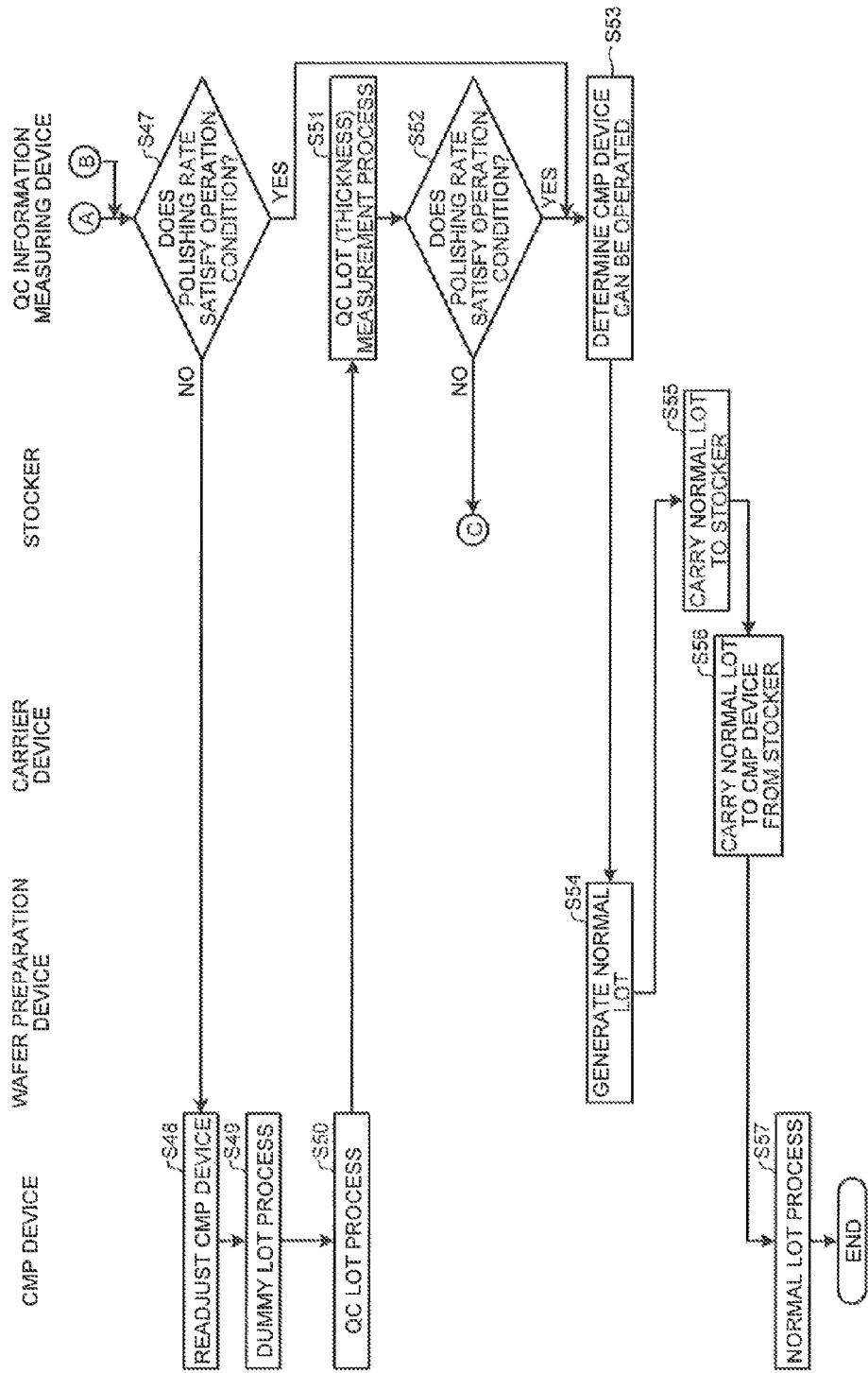

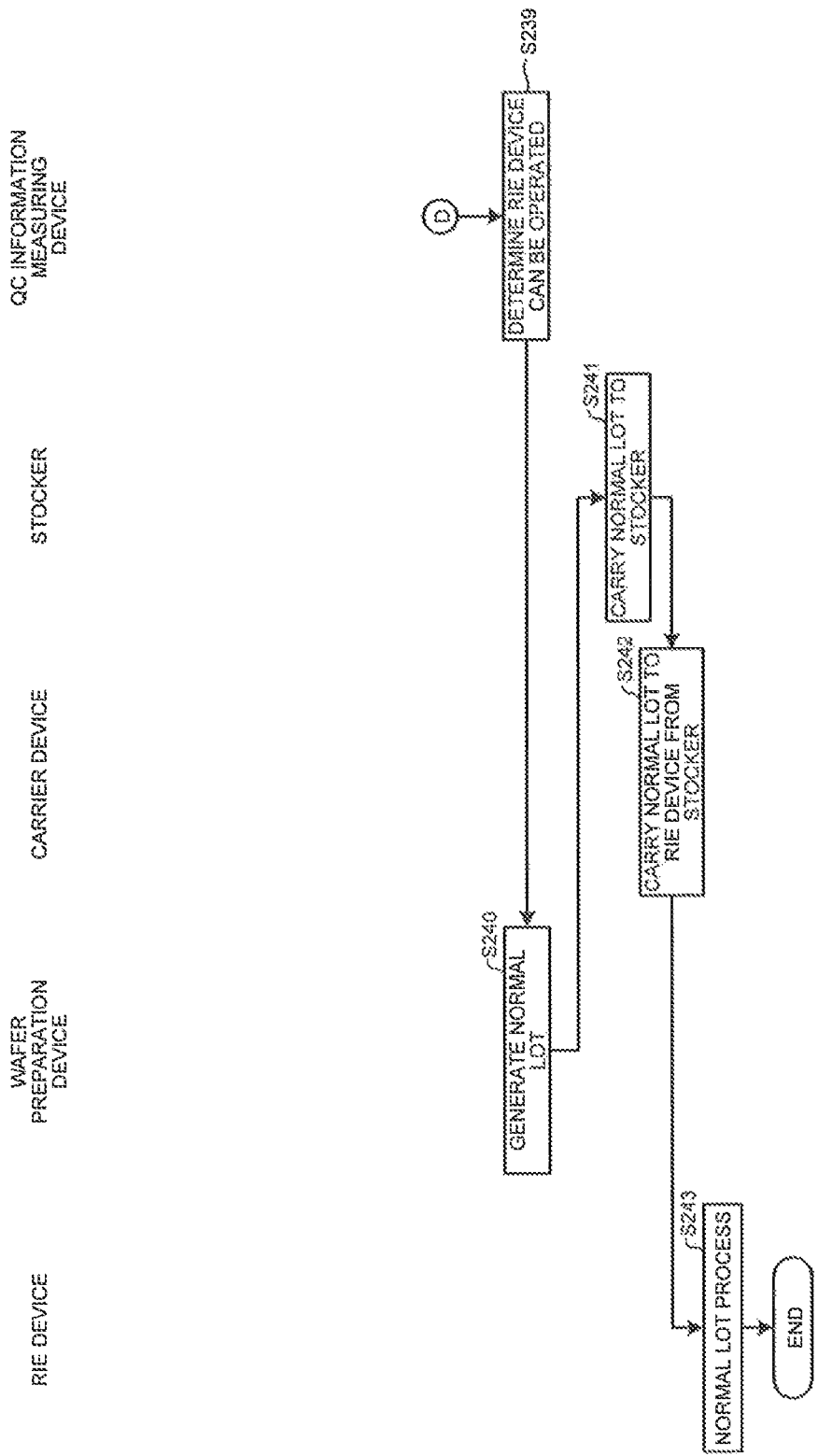

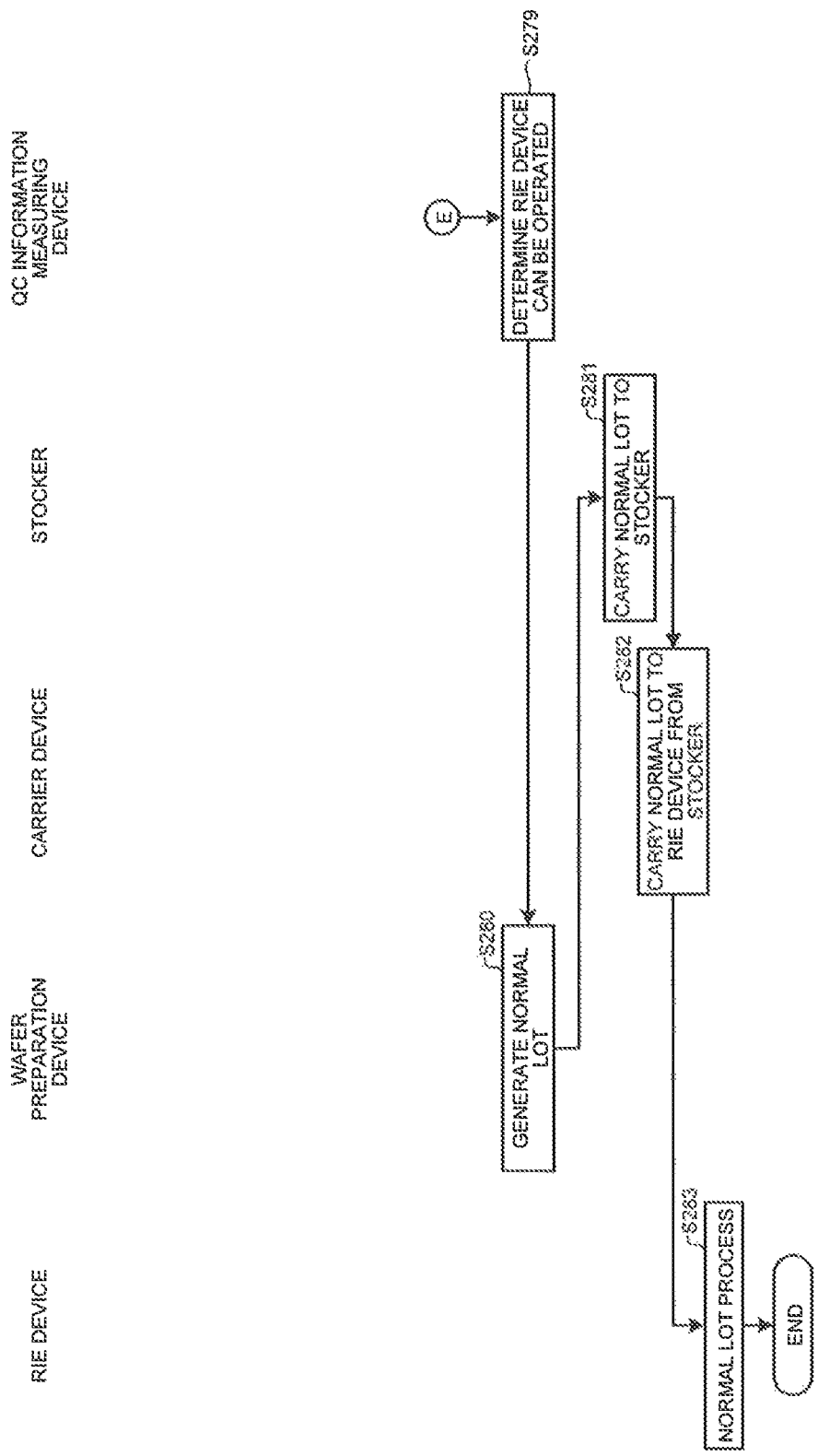

SEMICONDUCTOR MANUFACTURING PROCESS SYSTEM AND METHOD

CROSS-REFERENCE TO RELATED APPLICATIONS

This application is based upon and claims the benefit of priority from Japanese Patent Application No. 2012-189193, filed on Aug. 29, 2012; the entire contents of which are incorporated herein by reference.

FIELD

Embodiments described herein relate generally to a semiconductor manufacturing process system, and a semiconductor manufacturing process method.

BACKGROUND

In a CMP (Chemical Mechanical Polishing) process system, or a dry etching process system, for example, as a semiconductor manufacturing process system, a QC (Quality Control) operation is carried out. In the QC operation, a maintenance of a wafer processing device is carried out, when a process for a predetermined number of wafers is completed. After the maintenance is carried out, it is confirmed whether a number of foreign matters (dust, contamination) in the CMP device falls within a predetermined range or not.

In the conventional semiconductor manufacturing process system, the maintenance and the QC control are carried out by a different operator, in general. The operator for the maintenance is in touch with the operator carrying out the QC operation after the maintenance operation. Therefore, a waiting time might be generated before the start of the QC operation. In order to start the wafer processing device after the completion of the QC operation, a user has to wait for a judgment by an expert operator as to whether or not the process result of the QC operation satisfies a condition sufficient for starting the device. Therefore, a waiting time might also be generated before and after the judgment by the expert operator after the completion of the QC operation.

BRIEF DESCRIPTION OF THE DRAWINGS

FIGS. 8A and 8B are flowcharts illustrating one example of a process in the CMP process method according to the first embodiment;

FIGS. 16A and 16B are flowcharts illustrating one example of a procedure of a maintenance process according to the fifth embodiment;

FIGS. 18A and 18B are flowcharts illustrating one example of a procedure of a maintenance process according to the sixth embodiment.

DETAILED DESCRIPTION

In general, according to one embodiment, a semiconductor manufacturing process system is provided, the system including a storage container; a wafer processing device; a QC information measuring device; a wafer preparation device; and a carrier device, wherein the operations of the respective devices are controlled in accordance with a recipe. The storage container stores a predetermined number of wafers. The wafer processing device ejects the wafer from the storage container placed on a port, and performs a predetermined process thereto. The wafer processing device includes a processed number counting unit that adds and counts the number of the processed wafers; and a maintenance post-processing unit that performs a dummy lot process using a dummy lot that includes a dummy running wafer into the storage container, and a QC lot process using a QC lot that includes a wafer for measuring QC information, after the maintenance process in the wafer processing device is completed. The wafer preparation device puts the wafer, which is to be supplied to the wafer processing device, in the storage container for preparation. When the processed number counting unit in the wafer processing device counts a first processed number, the wafer preparation device prepares the dummy lot and the QC lot. The carrier device carries the storage container among the respective devices. When the processed number counting unit counts a second processed number that is larger than the first processed number, the carrier device allows the dummy lot and the QC lot, which are prepared by the wafer preparation device, to wait at a predetermined position, and carries these lots to the port of the wafer processing device simultaneous with the maintenance process until the maintenance process is completed.

The semiconductor manufacturing process system and a method according to the embodiments will be described in detail below with reference to the accompanying drawings. The present invention is not limited by these embodiments. A CMP process system and a dry etching process system will be described as one example of the semiconductor manufacturing process system. After a general process and problem in an operation of exchanging a pad in the general CMP process system are described, the CMP process system and the dry etching process system according to the embodiments will be described.

Figure 1:
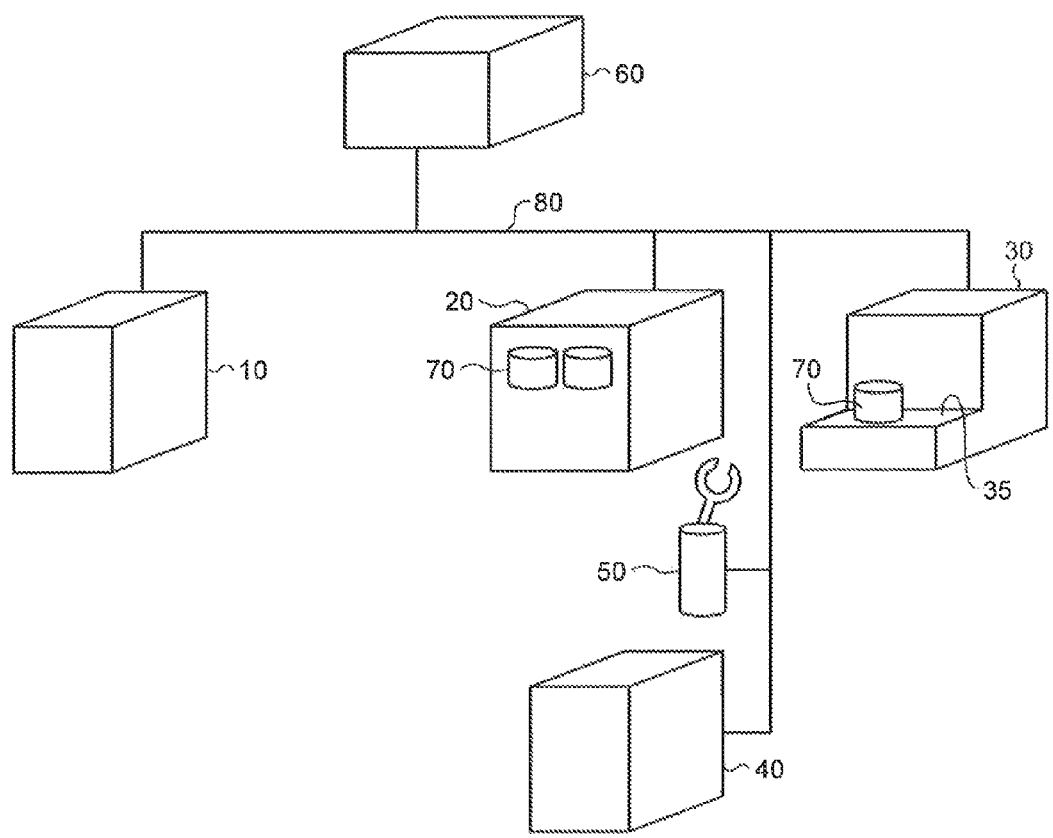
FIG. 1 is a diagram schematically illustrating a configuration of a general CMP process system.

FIG. 1 is a diagram schematically illustrating a configuration of a general CMP process system. The CMP process system includes a wafer preparation device 10, a stocker 20, a CMP device 30, a QC information measuring device 40, a carrier device 50, and a control device 60.

The wafer preparation device 10 generally performs a process of storing a wafer, which is a subject to be processed, and which is to be a product, into a storage container 70 such as a FOUP (Front Opening Unified Pod), performs a process of storing a dummy wafer in the storage container 70 during a dummy lot process after the exchange of a polishing pad of the CMP device 30, and performs a process of storing a QC processing wafer into the storage container 70 during a QC lot process. The storage container 70 stores plural wafers, and is used for carrying the wafers to the respective devices.

The stocker 20 is arranged near the CMP device 30, and the storage container 70 storing the wafer that is to be processed in the CMP device 30 is placed thereon. The storage container 70 is carried between the wafer preparation device 10 and the stocker 20 by a carrier device, not illustrated, using a carrier system such as OHT (Over Head Hoist Transport).

Figure 2:
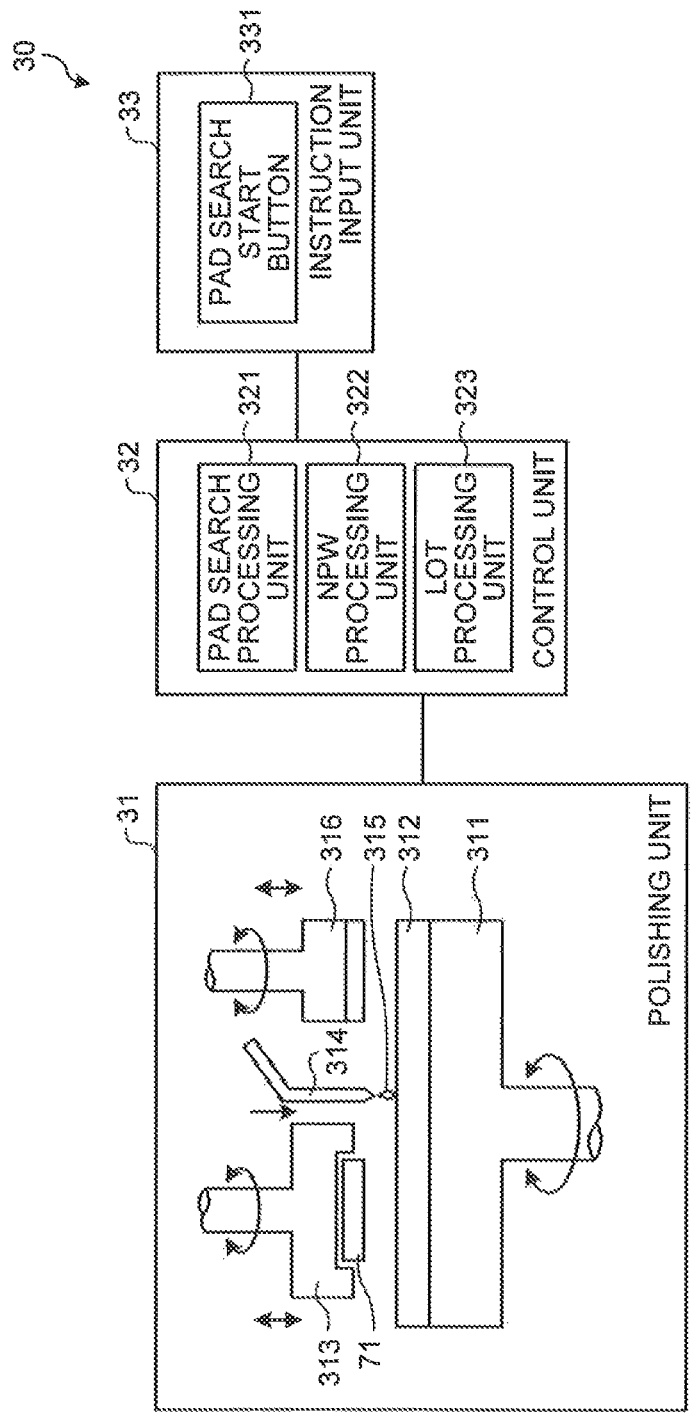
FIG. 2 is a diagram schematically illustrating one example of a configuration of a general CMP device.

The CMP device 30 polishes and planarizes the wafer in the storage container 70 carried from the stocker 20. The CMP device 30 externally has a load port 35 on which the storage container 70 is placed. FIG. 2 is a diagram schematically illustrating one example of a configuration of the general CMP device. The CMP device 30 includes a polishing unit 31 that performs a polishing process of the wafer 71, a control unit 32 that controls the process at the polishing unit 31, and an instruction input unit 33 that transmits an instruction from an operator to the control unit 32.

The polishing unit 31 includes a rotatable polishing table 311, a polishing pad 312 attached on the polishing table 311 through an adhesive layer not illustrated, a polishing head 313 that is arranged above the polishing pad 312 for holding the wafer 7L, a chemical supply nozzle 314 for supplying chemical, such as polishing slurry 315, during the polishing process, and a dresser 316 that is arranged above the polishing pad 312 and made of, for example, a diamond disk for toothing the polishing pad 312.

The control unit 32, when the polishing pad 312 is exchanged, includes a pad search processing unit 321 that allows the polishing unit 31 to execute a pad search process (initialization process) for performing a positioning process or a height adjustment of the polishing pad 312 by using a non-product wafer (hereinafter referred to as NPW), an NPW processing unit 322 that allows the polishing unit 31 to execute a dummy operation by using the NPW after the pad search process, and a lot processing unit 323 that allows the polishing unit 31 to execute a polishing process by removing the wafer 71 from the storage container 70 on the load port 35 during the dummy lot process, QC lot process, or normal lot process.

The instruction input unit 33 includes a pad search start button 331 that gives an instruction of executing the pad search process during the exchange of the polishing pad 312. The pad search processing unit 321 in the control unit 32 starts the pad search process, when the pad search start button 331 is depressed.

Although not illustrated, the CMP device 30 also includes an NPW storing unit that stores an NPW used to correct force applied when the polishing head 313 presses the wafer 71 to the polishing pad 312, or used for break-in operation after the polishing pad 312 is exchanged, and an NPW carrier unit that carries the NPW between the NPW storing unit and the polishing head 313.

The polishing process in the CMP device 30 will briefly be described. During the polishing, the wafer 71 is ejected from the storage container 70 placed on the load port 35, and the wafer 71 is held by the polishing head 313 by a unit such as a vacuum chuck holder. With this state, the wafer 71 is pressed against the polishing pad 312, and the polishing slurry 315 is supplied from the chemical supply nozzle 314, while rotating the polishing table 311 holding the polishing pad 312 and the polishing head 313. Thus, a film on the surface of the wafer 71 is polished. The quality on the surface of the polishing pad 312 is changed after the polishing process. Therefore, the dresser 316 is pressed against the polishing pad 312 to carry out toothing of the polishing pad 312. However, after the number of the polished wafers 71 reaches a predetermined number, a desired polishing property cannot be attained, even if the toothing is carried out, and this is at the end of the life of the polishing pad 312. Accordingly, the polishing pad 312 is exchanged. The process of exchanging the polishing pad 312 in the CMP process system will mainly be described below.

The QC information measuring device 40 measures QC information for determining whether or not an operation reference by which the CMP device 30 can be operated is satisfied after the exchange of the polishing pad 312. The QC information is information serving as an index for keeping the quality in the polishing process by the CMP device 30, or information serving as a basis for calculating the index. For example, the QC information is a number of foreign matters (dust, contamination) in the CMP device 30, or polishing rate.

Figure 3:
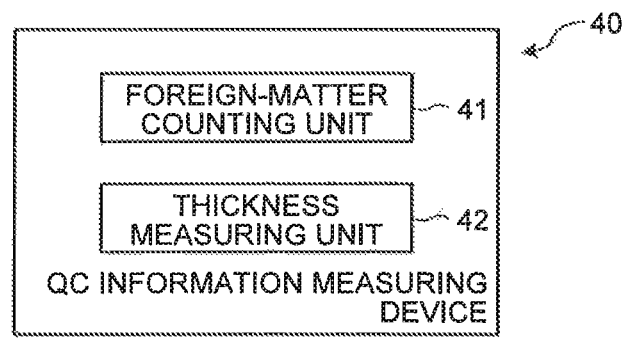
FIG. 3 is a block diagram schematically illustrating one example of a configuration of a QC information measuring device.

FIG. 3 is a block diagram schematically illustrating one example of a configuration of the QC information measuring device. The QC information measuring device 40 includes a foreign-matter counting unit 41 that counts a number of foreign matters, and a thickness measuring unit 42 that measures the thickness of the film on the wafer 71.

A wafer surface testing device using a laser microscope can be used as the foreign-matter counting unit 41, for example. The foreign-matter counting unit 41 confirms whether a chip of the polished film remains on the wafer 71 or not, or whether a foreign matter is present or not on a predetermined portion after the maintenance process. The foreign-matter counting unit 41 executes an initial measurement for measuring a number of foreign matters before the execution of the QC lot process, and an after measurement for measuring the number of foreign matters after the completion of the QC lot process, in accordance with the instruction from the control device 60.

The thickness measuring unit 42 measures a thickness of an oxide film or a nitride film on the wafer 71, which is polished by the CMP device 30 according to a recipe, on plural positions. An optical thickness measuring device such as an ellipsometer can be used as the thickness measuring unit 42. The thickness measuring unit 42 measures the thickness before the QC lot process in the initial measurement, and measures the thickness after the QC lot process in the after measurement.

The carrier device 50 carries the storage container 70 among the stocker 20, the CMP device 30, and the QC information measuring device 40.

Figure 4:
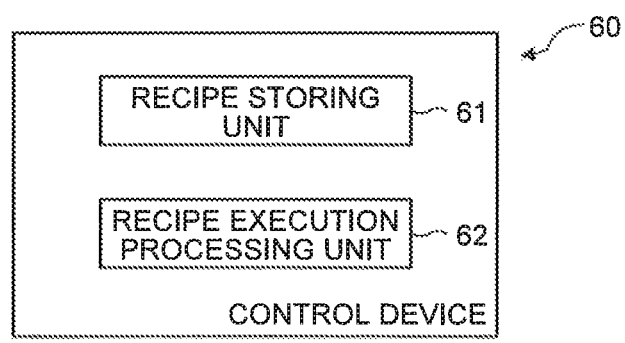
FIG. 4 is a block diagram schematically illustrating one example of a configuration of a control device.

The control device 60 controls the operation of each device in the CMP process system according to the recipe describing the way of the CMP process created beforehand. FIG. 4 is a block diagram schematically illustrating one example of the configuration of the control device. The control device 60 includes a recipe storing unit 61, and a recipe execution processing unit 62.

The recipe storing unit 61 stores the recipe for controlling the operation of each device in the CMP process system. A normal wafer procedure is specified in the recipe. The recipe execution processing unit 62 transmits a signal for instructing each device in the CMP process system to execute the process based upon the recipe in the recipe storing unit 61.

The control device 60 is connected to the wafer preparation device 10, the stocker 20, the CMP device 30, the QC information measuring device 40, and the carrier device 50 through a communication network 80. The instruction according to the recipe is transmitted to each device from the control device 60 through the communication network 80, and information necessary for the control is transmitted to the control device 60 from each device.

Figure 5:
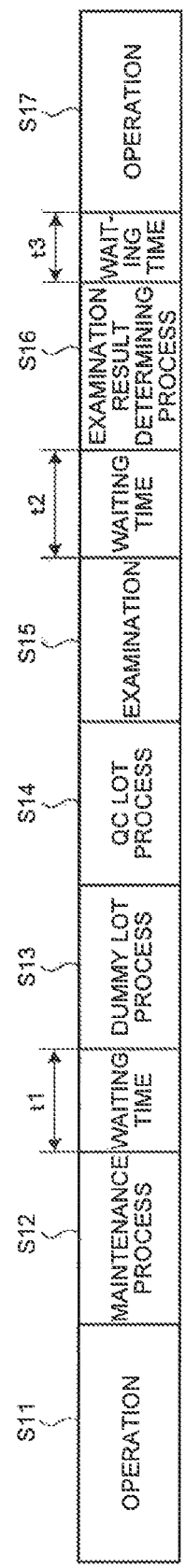
FIG. 5 is a view schematically illustrating a flow of a general process of exchanging a polishing pad in the CMP process system.

Next, the general process of exchanging the polishing pad 312 in the CMP process system thus configured will be described. FIG. 5 is a view schematically illustrating a flow of the general process of exchanging the polishing pad in the CMP process system. Firstly, the CMP device 30 is supposed to be in an operation state of polishing the wafer 71 that is to become a product (step S11). When the number of the processed wafers 71 in the CMP device 30 reaches the predetermined number, a maintenance operator carries out a maintenance process including the exchange of the polishing pad 312 after the CMP process for the wafer 71 is completed (step S12). In this maintenance process, the pad search process using the NPW, the cleaning process of the NPW, and the break-in operation using the NPW are carried out after the exchange of the polishing pad 312.

After the maintenance process is completed, the maintenance operator notifies an operator of the CMP device 30 of the completion of the maintenance process. When receiving the notification of the completion of the maintenance process, the operator allows the CMP device 30 to execute the dummy lot process (step S13). In the dummy lot process, when the operator issues an instruction of the preparation of the dummy lot, the wafer preparation device 10 prepares the dummy lot, and this dummy lot is carried to the stocker 20. Thereafter, the carrier device 50 carries the storage container 70 to the load port 35 of the CMP device 30 from the stocker 20. In the CMP device 30, the wafer 71 is conveyed to the polishing head 313 from the storage container 70 by an internal wafer conveyance mechanism, and the dummy running is executed for getting the CMP device 30 after the exchange of the polishing pad 312 into good condition.

After the dummy lot process is completed, the operator allows the CMP device 30 to execute the QC lot process (step S14). In the QC lot process, when the operator issues an instruction of the QC lot process, the wafer preparation device 10 prepares the QC lot, and this QC lot is conveyed to the stocker 20. Here, it is supposed that the storage container 70 for the QC lot stores two measuring wafers, which are a wafer used for counting foreign matters (hereinafter referred to as a foreign-matter counting wafer), and a wafer used for measuring the polishing rate (hereinafter referred to as a polishing-rate measuring wafer). Thereafter, the storage container 70 is conveyed to the QC information measuring device 40 by the carrier device 50, whereby the initial measurement is performed. In the initial measurement, the foreign-matter counting unit 41 counts the number of foreign matters on the surface of the foreign-matter counting wafer, and the thickness measuring unit 42 measures the thickness of the polishing-rate measuring wafer on which an oxide film or nitride film with a predetermined thickness is formed at the predetermined position. Then, the storage container 70 is conveyed to the load port 35 of the CMP device 30 by the carrier device 50. The CMP device 30 polishes the polishing-rate measuring wafer according to the recipe. The foreign-matter counting wafer also passes through the CMP device 30. Then, the storage container 70 is conveyed to the QC information measuring device 40 by the carrier device 50, and the after measurement is carried out. In the after measurement, the foreign-matter counting unit 41 counts the number of foreign matters on the surface of the foreign-matter counting wafer, and the thickness measuring unit 42 measures the thickness of the polishing-rate measuring wafer at the predetermined position. The thickness measuring unit 42 may measure the thickness on plural positions of the polishing-rate measuring wafer. Then, the storage container 70 is conveyed to the stocker 20 by the carrier device 50.

Next, the operator performs an examination by using the result of the QC lot process (step S15), and creates the examination result. For example, the operator calculates the number of foreign matters deposited in the CMP device 30 from the difference between the result in the after measurement and the result in the initial measurement. The operator also obtains the thickness on the predetermined position from the difference between the result in the initial measurement and the result in the after measurement, and calculates the polishing rate by using the polishing time in the recipe.

Thereafter, the operator delivers the examination result to an operator for determining the examination result. The operator for determining the examination result determines whether the examination result satisfies a condition (standard) for operating the CMP device 30 or not, and returns the result to the operator (step S16). For example, the operator for determining the examination result determines whether the number of foreign matters falls within a predetermined range or not. The operator for determining the examination result also determines whether the polishing rate is as described in the recipe or not, and whether the variation in the polishing rate in the plane of the wafer 71 falls within a predetermined range or not. It is determined that the CMP device 30 can be operated, when the number of foreign matters falls within the predetermined range, the polishing rate is as described in the recipe, and the variation in the polishing rate in the plane of the wafer 71 falls within the predetermined range. When the examination result is determined to satisfy the operation condition, the CMP device 30 executes the polishing process by using the normal lot (step S17).

When the number of foreign matters does not satisfy the operation condition in the determination in step S16, the process from step S13 is again executed. When the number of foreign matters satisfies the operation condition in step S15, the CMP device 30 is started. When the number of foreign matters does not satisfy the operation condition, the maintenance process in step S12 is again executed. When the polishing rate does not satisfy the operation condition, the process of measuring the thickness in the QC lot process in step S14 is executed, and when the result satisfies the operation condition, the CMP device 30 is started. When the result does not satisfy the operation condition, the maintenance process in step S12 is again executed.

In the general CMP process system, a waiting time t1 is generated between the maintenance process in step S12 and the dummy lot process in step S13, since the maintenance operator gives information involved with the maintenance process to the operator of the CMP device 30. Waiting times t2 and t3 are also generated due to the manual determination of the examination result between the examination process in step S15 and the process of determining the examination result in step S16, and between the process of determining the examination result in step S16 and the operating process of the normal lot in step S17.

As described above, in the general process of exchanging the polishing pad 312 in the CMP process system, plural persons, such as the maintenance operator, the operator of the CMP device 30, and the operator for determining the examination result, are involved. The waiting time t1+t2+t3 is generated due to the communication of the information among these persons. Specifically, wasted time is lost until the CMP device 30 is again started after the exchange of the polishing pad 312. In view of this, a CMP process system that can reduce the wasted time will be described in the embodiments below.

First Embodiment

A CMP process system according to a first embodiment includes a wafer preparation device 10, a stocker 20, a CMP device 30, a QC information measuring device 40, a carrier device 50, and a control device 60, as in FIG. 1. The configuration of the CMP device 30 and the configuration of the QC information measuring device 40 are different from those in FIG. 1. The portion different from the general CMP process system will be described below.

Figure 6:
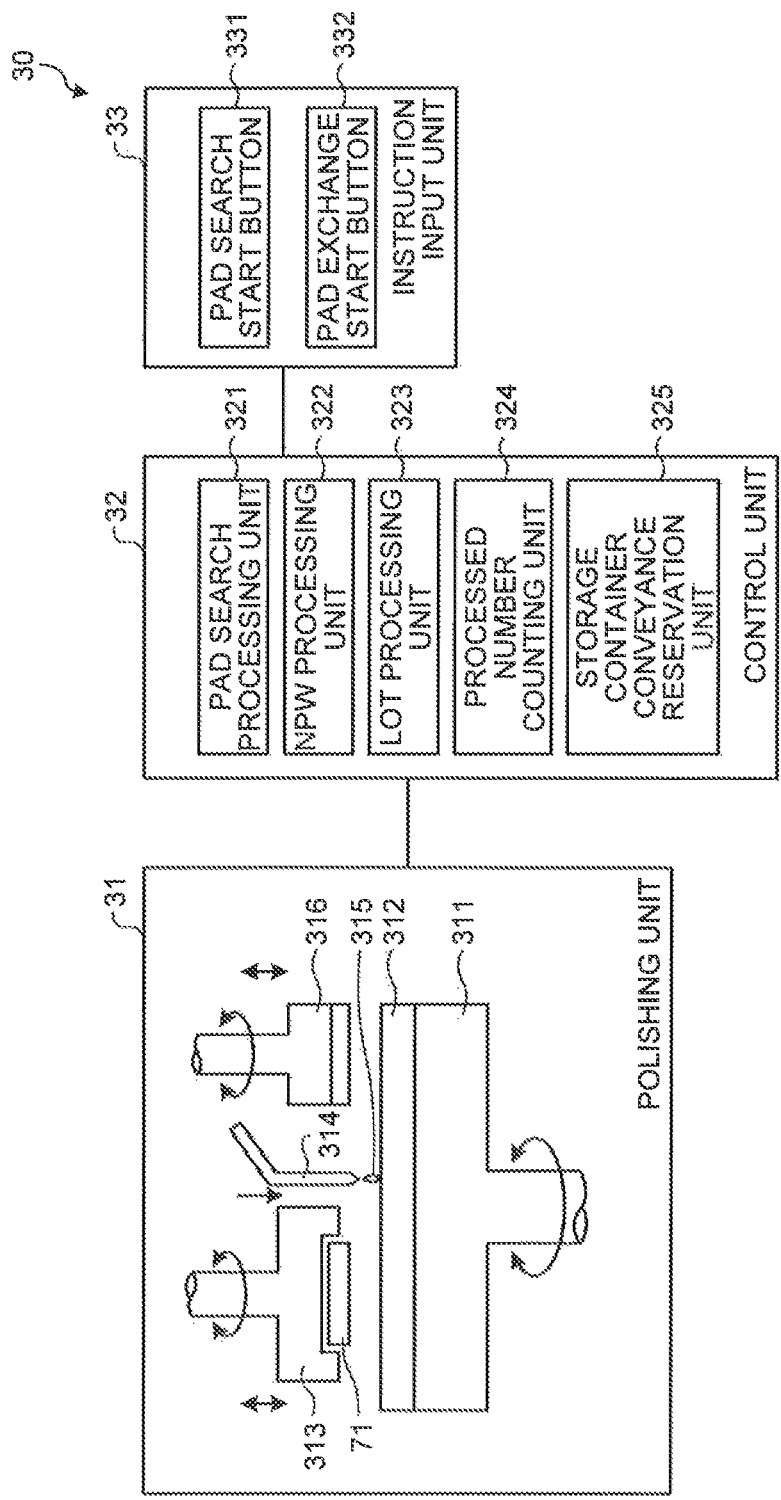
FIG. 6 is a view schematically illustrating one example of a configuration of a CMP device according to a first embodiment.

FIG. 6 is a diagram schematically illustrating one example of a configuration of the CMP device according to the first embodiment. The CMP device 30 includes a processed number counting unit 324 and a storage container conveyance reservation unit 325 in the control unit 32 in the CMP device in FIG. 2, and includes a pad exchange start button 332 in the instruction input unit 33.

The processed number counting unit 324 adds and counts the number of wafers 71 that undergo the polishing process after the exchange of the polishing pad 312 of the CMP device 30. After counting the predetermined number of processed wafers 71, the processed number counting unit 324 transmits a signal to the respective devices in the CMP process system. After the polishing pad 312 of the polishing unit 31 is exchanged, the processed number counting unit 324 resets the counted number of the processed wafers 71. When the pad exchange start button 332 in the instruction input unit 33 is depressed, the storage container conveyance reservation unit 325 performs an automatic carrier control of the dummy lot and the QC lot. When the pad exchange start button 332 is depressed by the maintenance operator, it reports the start of the pad exchange process to the control unit 32.

The pad search processing unit 321 has a function of monitoring the condition of the CMP device 30 after the depression of the pad exchange start button 332, and transmitting a pad search completion signal to the CMP process system after the completion of the pad search process using the NPW. The components same as those in FIG. 2 are identified by the same numerals, and the description thereof will not be repeated.

Figure 7:
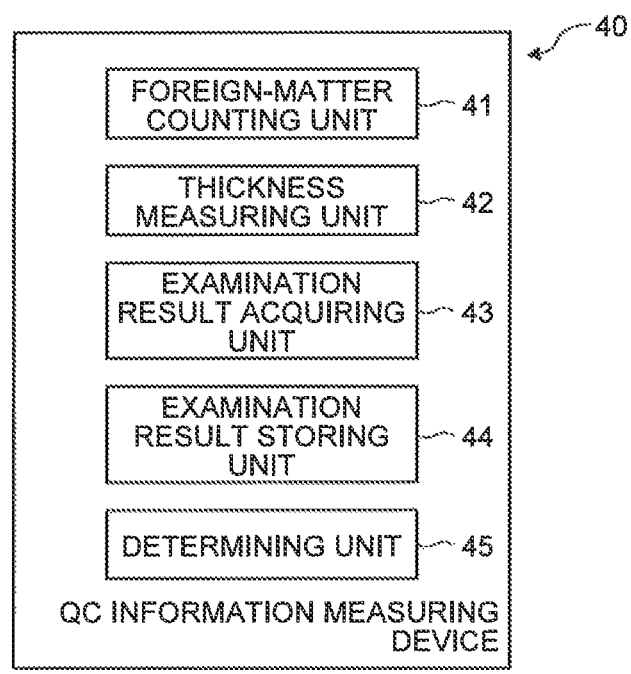
FIG. 7 is a block diagram schematically illustrating one example of a configuration of a QC information measuring device in the CMP process system according to the first embodiment.

FIG. 7 is a block diagram schematically illustrating one example of a configuration of the QC information measuring device in the CMP process system according to the first embodiment. The QC information measuring device 40 further includes an examination result acquiring unit 43, an examination result storing unit 44, and a determining unit 45 in the QC information measuring device in FIG. 3.

The examination result acquiring unit 43 calculates the examination result, used for the determination as to whether the CMP device 30 can be operated or not, from the result of the measurement by the foreign-matter counting unit 41 and the thickness measuring unit 42. For example, the examination result acquiring unit 43 calculates the number of foreign matters, which is the difference between the counted value of the foreign matters in the after measurement and the counted value of the foreign matters in the initial measurement by the foreign-matter counting unit 41, as the examination result. The examination result acquiring unit 43 also calculates the thickness of the polished film, which is the difference between the thickness in the initial measurement and the thickness in the after measurement by the thickness measuring unit 42, for each of the predetermined positions on the measured wafer 71, and calculates, as the examination result, the polishing rate on the predetermined position on the wafer 71 from the thickness of the polished film and the polishing time specified by the recipe. It also calculates the average polishing rate obtained by averaging the polishing rate at each position on the wafer 71.

The examination result storing unit 44 stores the examination result acquired by the examination result acquiring unit 43. It stores the examination result of a predetermined number (e.g., 100 in the past).

The determining unit 45 determines whether the examination result acquired by the examination result acquiring unit 43 satisfies the condition indicating that the CMP device 30 can be operated or not, by using the completion of the after measurement by the foreign-matter counting unit 41 and the thickness measuring unit 42 as a trigger. The determining unit 45 determines whether or not the number of foreign matters satisfies the operation condition, and whether the polishing rate satisfies the operation condition or not. When both examination results satisfy the operation condition, the determining unit 45 allows the process of the CMP device 30 using the normal lot. When either one of them does not satisfy the operation condition, the determining unit 45 does not allow the process using the normal lot.

The determining unit 45 also has a function of acquiring a tendency in the variation of each value from the examination result (the number of foreign matters and polishing rate) in the past stored in the examination result storing unit 44, in order to determine whether the trend of the examination result indicates a predetermined tendency that is unsuitable for allowing the operation of the CMP device 30, and determining whether the CMP device 30 can be operated or not based upon the result. This process is carried out by statistical quality control of the data, which is acquired by the foreign-matter counting unit 41 and the thickness measuring unit 42 and which has been subject to QDC process.

The CMP process method in the CMP process system thus configured will be described. FIGS. 8A and 8B are flowcharts illustrating one example of a process in the CMP process method according to the first embodiment. Firstly, when the processed number counting unit 324 in the CMP device 30 counts an alarm number (first alarm number) of the processed wafers 71 that is less than an upper-limit number (second alarm number) of the processed wafers 71 by a predetermined number (e.g., by the processed number in one lot) in the CMP device 30 (step S30), the processed number counting unit 324 transmits a signal indicating that the counted number reaches the alarm number to the CMP process system. When receiving the alarm number signal, the wafer preparation device 10 prepares the dummy lot and the QC lot (step S31). The QC information measuring device 40 performs the QC lot measuring process (initial measurement) for the QC lot (step S32).

Next, when the number of the processed wafers 71 reaches the upper-limit number in the processed number counting unit 324 in the CMP device 30 (step S33), the processed number counting unit 324 transmits a signal, indicating that the number of the processed wafers 71 reaches the upper-limit number, to the CMP process system. When receiving the upper-limit signal, the dummy lot and the QC lot are conveyed from the wafer preparation device 10 to the stocker 20.

The dummy lot and the QC lot are held in the stocker 20, so that they are in a stand-by state (step S34). When receiving the upper-limit signal, the control device 60 notifies the maintenance operator of the situation that the time to carry out the maintenance process of the CMP device 30 has come (step S35). This notification is given to the maintenance operator by sending an e-mail to a mobile information terminal of the maintenance operator or allowing the mobile information terminal to sound.

Thereafter, the maintenance operator carries out the maintenance process of the CMP device 30 (step S36). The maintenance process same as that in step S12 in FIG. 5 is executed. Simultaneous with the maintenance process, the carrier device 50 carries the dummy lot and the QC lot, which are in the stand-by state in the stocker 20, to the CMP device 30 (step S37). The process of conveying these lots is completed until the maintenance process by the maintenance operator is completed. More specifically, the time to start the conveyance of the dummy lot and the QC lot is set such that the conveyance of the dummy lot and the QC lot to the CMP device 30 is completed before the maintenance process is finished.

After the maintenance process is finished, the dummy lot process is executed by using the dummy lot conveyed to the load port 35 of the CMP device 30 before the completion of the maintenance process (step S38), and then, the QC lot process is executed by using the QC lot conveyed to the load port 35 of the CMP device 30 (step S39). Since the dummy lot and the QC lot are conveyed to the CMP device 30 before the start of the dummy lot process, the dummy lot process is executed after the maintenance process without any waiting time. Since the dummy lot and the QC lot are simultaneously conveyed to the CMP device 30, the QC lot process can be executed after the dummy lot process without any waiting time. The dummy lot process and the QC lot process as in steps S13 and S14 in FIG. 5 are performed.

Then, the QC lot measurement process using the QC information measuring wafer is performed by the foreign-matter counting unit 41 and the thickness measuring unit 42 in the QC information measuring device 40 (step S40), and the examination result acquiring unit 43 calculates the examination result from the measurement result by the foreign-matter counting unit 41 and the thickness measuring unit 42, so as to generate the QC information (step S41).

Thereafter, the determining unit 45 determines whether the CMP device 30 can be operated or not from the QC information (examination result). Here, the determining unit 45 determines whether the number of foreign matters and the polishing rate satisfy the operation condition of the CMP device 30.

Firstly, the determining unit 45 determines whether the number of foreign matters satisfies the operation condition or not (step S42). When the number of foreign matters does not satisfy the operation condition (No in step S42), the CMP device 30 performs the dummy lot process (step S43). Then, the CMP device 30 performs the QC lot process (step S44), and then, the QC information measuring device 40 performs the QC lot measurement process (step S45). In the QC lot measurement process, the process of counting the number of foreign matters is executed in the foreign-matter counting unit 41. The determining unit 45 again determines whether the number of foreign matters satisfies the operation condition or not (step S46). When the number of foreign matters does not satisfy the operation condition (No in step S46), the process returns to step S36.

When the number of foreign matters satisfies the operation condition in step S46 (Yes in step S46), or when the number of foreign matters satisfies the operation condition in step S42 (Yes in step S42), the determining unit 45 determines whether the polishing rate satisfies the operation condition or not (step S47). Here, the variation in the average polishing rate and the polishing rate is examined as the polishing rate. When the polishing rate does not satisfy the operation condition (No in step S47), the maintenance operator performs the readjustment process of the CMP device 30 (step S48), and then, the CMP device 30 performs the dummy lot process (step S49) and the QC lot process (step S50). Thereafter, the QC information measuring device 40 performs the QC lot measurement process (step S51). In the QC lot measurement process, the thickness measuring unit 42 performs the process of measuring the thickness. The examination result acquiring unit 43 calculates the polishing rate by using the result of the QC lot measurement process, and determines again whether the polishing rate satisfies the operation condition or not (step S52). When the polishing rate does not satisfy the operation condition (No in step S52), the process returns to step S36.

When the polishing rate satisfies the operation condition in step S47 or step S52 (Yes in step S47 or S52), the determining unit 45 determines that the CMP device 30 can be operated (step S53), and issues an instruction of preparing the normal lot to the wafer preparation device 10.

Thereafter, the wafer preparation device 10 generates the normal lot (step S54), and the storage container of the normal lot is conveyed to the stocker 20 (step S55). The carrier device 50 carries the storage container of the normal lot to the CMP device 30 from the stocker 20 (step S56). Then, the CMP device 30 performs the normal lot process (step S57), and the process is ended. Thus, the process method in the maintenance process of the CMP device 30 is completed.

The QC lot process in step S39 is executed after the dummy lot process in step S38. However, the initial process may be executed after the preparation of the QC lot in step S32, and the QC lot process can be executed on any timing. The initial measurement in the QC lot process in steps S44 and S50 may be executed before the dummy lot process in steps S43 and S49.

The recipe stored in the recipe storing unit 61 in the control device 60 specifies the procedure illustrated in FIGS. 8A and 8B, for example. The control device 60 issues an instruction to each device to execute the process.

As illustrated in FIGS. 8A and 8B, the dummy lot and the QC lot are conveyed to the load port 35 of the CMP device 30, and brought into the stand-by state before the maintenance process is finished. Accordingly, the dummy lot process can be started just after the completion of the maintenance process, whereby the waiting time generated by a manual work between the maintenance process and the dummy process described in FIG. 3 can be eliminated.

The QC lot process is continuously executed after the dummy lot process, and the determining unit 45 in the QC information measuring device 40 automatically determines whether or not the operation condition for the CMP device 30 is satisfied or not based upon the result acquired in the QC lot measurement process after the QC lot process. When the CMP device 30 can be operated, the CMP process using the normal lot is executed just after the determination. Thus, the time up to the operation can be shortened, compared to the general case (in FIG. 5) in which the examination result in the QC lot process is delivered to the operator for determining the examination result, and the CMP device 30 is operated after the operator for determining the examination result approves the operation of the CMP device 30.

In the first embodiment, the conveyance of the dummy lot and the QC lot to the load port 35 of the CMP device 30 is completed before the maintenance process is finished, whereby the dummy lot process can be started just after the completion of the maintenance process. The process using the dummy lot and the process using the QC lot are continuously executed, and the determination as to whether the CMP device 30 can be operated or not is automatically made by using the information acquired by the QC lot process without human intervention. This provides an effect that the time from when the process for the production lot is stopped until the process for the production lot is started after the maintenance during the maintenance of the CMP process system can be shortened more than in the conventional case. The number of the production lots that can be processed during the predetermined period can be increased by the saved time.

Second Embodiment

In the embodiment below, the detail of the process in the maintenance process in step S36 in FIG. 8A and the detail of the carrying process of the dummy lot and the QC lot to the CMP device will be described.

Figure 9:
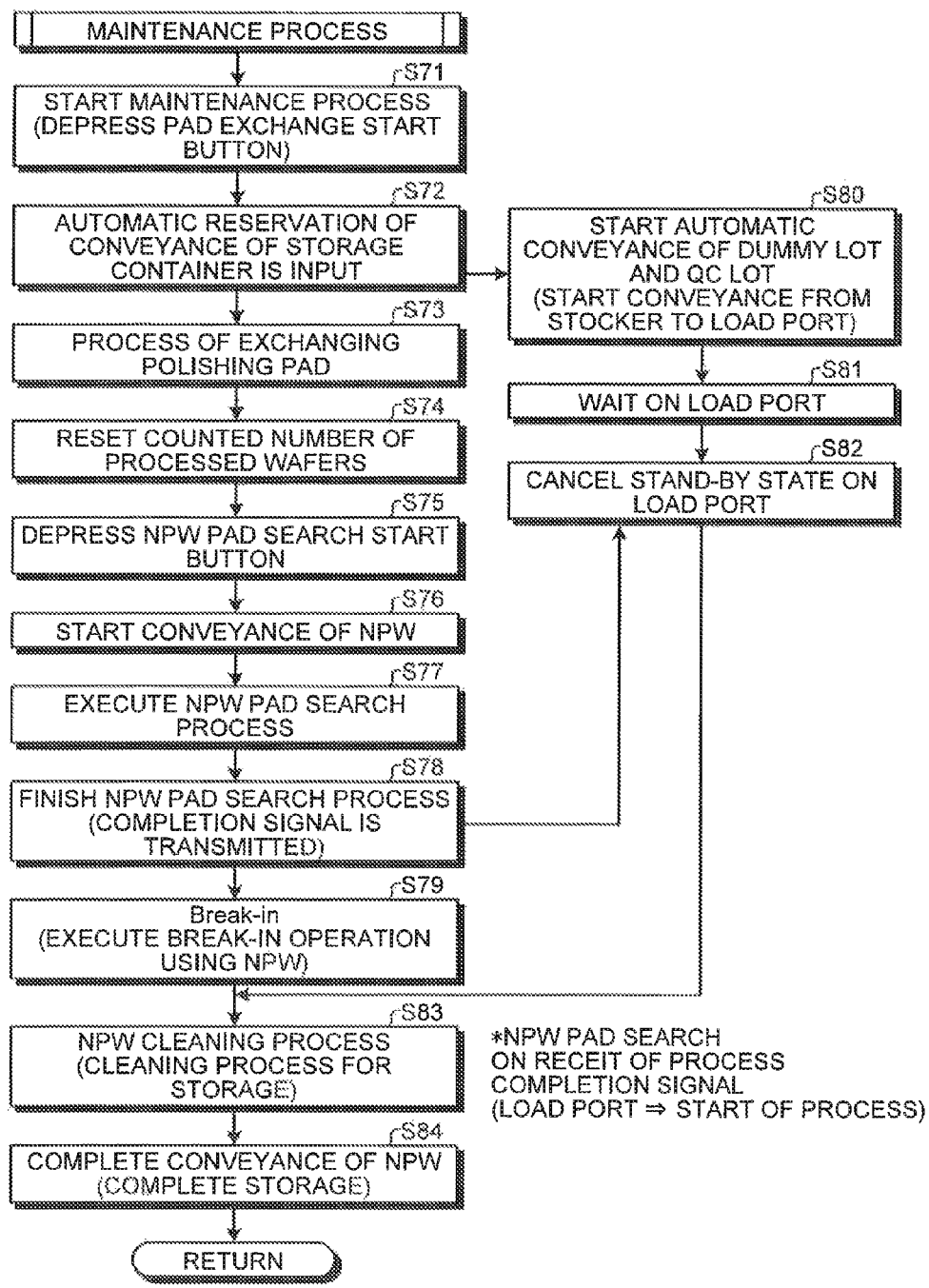
FIG. 9 is a flowchart illustrating one example of a procedure of a maintenance process according to a second embodiment.

FIG. 9 is a flowchart illustrating one example of a procedure of a maintenance process according to the second embodiment. In the maintenance process according to the second embodiment, the maintenance process is started when the maintenance operator depresses the pad exchange start button 332 in the instruction input unit 33 in the CMP device 30 (step S71). The automatic reservation of the conveyance of the storage container is input to the storage container conveyance reservation unit 325 in the control unit 32 by the depression of the pad exchange start button 332 (step S72).

Then, the maintenance operator carries out the process of exchanging the polishing pad 312 (step S73). Thereafter, the maintenance operator resets the counted value of the processed number of wafers in the processed number counting unit 324 in the control unit 32 (step S74), and depresses the pad search start button 331 in the instruction input unit 33 (step S75). Thus, the NPW is started to be conveyed to the polishing head 313 from the storage position of the NPW in the CMP device 30 (step S76), whereby the pad search process is executed (step S77). In the pad search process, the positioning process and the height adjustment of the polishing pad 312 are executed by using the NPW. After the pad search process is completed (step S78), the break-in operation (break-in) using the NPW is executed (step S79).

When the automatic reservation of the conveyance of the storage container is input in step S72, the stand-by state of the dummy lot and the QC lot on the stocker 20 is canceled simultaneous with the processes in steps S72 to S77, whereby the dummy lot and the QC lot are automatically conveyed to the load port 35 of the CMP device 30 from the stocker 20 (step S80). These lots are conveyed to the load port 35 of the CMP device 30, and brought into stand-by state there (step S81). When the pad search process is finished in step S78, and a completion signal is output (transmitted) to the device in the system by the pad search processing unit 321 in the CMP device 30, the stand-by state of the dummy lot and the QC lot on the load port 35 is canceled (step S82). Thereafter, the process is started for the dummy lot and the QC lot placed on the load port 35.

When the break-in operation using the NPW in step S79 is finished, the cleaning process of the NPW is executed (step S83). The cleaning process is executed in order to store the NPW at the original storage position. When the cleaning process of the NPW is finished, a process of conveying the NPW is carried out for storing the NPW on the original storage portion in the CMP device 30 (step S84). Then, the storage of the NPW is completed. Thus, the maintenance process is completed, and the process returns to the flowchart in FIG. 8A.

The time taken from the point when the automatic reservation of the conveyance of the storage container is input in step S72 till the point when the break-in operation using the NPW in step S79 is finished is longer than the time taken to carry the dummy lot and the QC lot to the load port 35 from the stocker 20. Therefore, the dummy lot and the QC lot are brought into the stand-by state on the load port 35 before the completion of the break-in operation using the NPW. When the storage of the NPW is completed after the NPW cleaning process, the CMP device 30 executes the processes on step S38 and the subsequent steps in FIG. 8A according to the first embodiment.

In the second embodiment, when the automatic reservation of the conveyance of the storage container is input in the maintenance process, the conveyance of the dummy lot and the QC lot to the load port 35 of the CMP device 30 from the stocker 20 is started. Therefore, the dummy lot and the QC lot can be transferred to the load port 35 before the completion of the maintenance process. As a result, the dummy process and the QC lot process can be executed after the maintenance process without any waiting time.

Third Embodiment

In the second embodiment, the dummy lot and the QC lot are conveyed to the load port of the CMP device from the wafer preparation device, when the pad exchange start button is depressed. However, the dummy lot and the QC lot may be in the stand-by state on the stocker 20. A third embodiment describes the case where the dummy lot and the QC lot are conveyed to the stocker 20, and brought into the stand-by state on the stocker 20.

Figure 10:
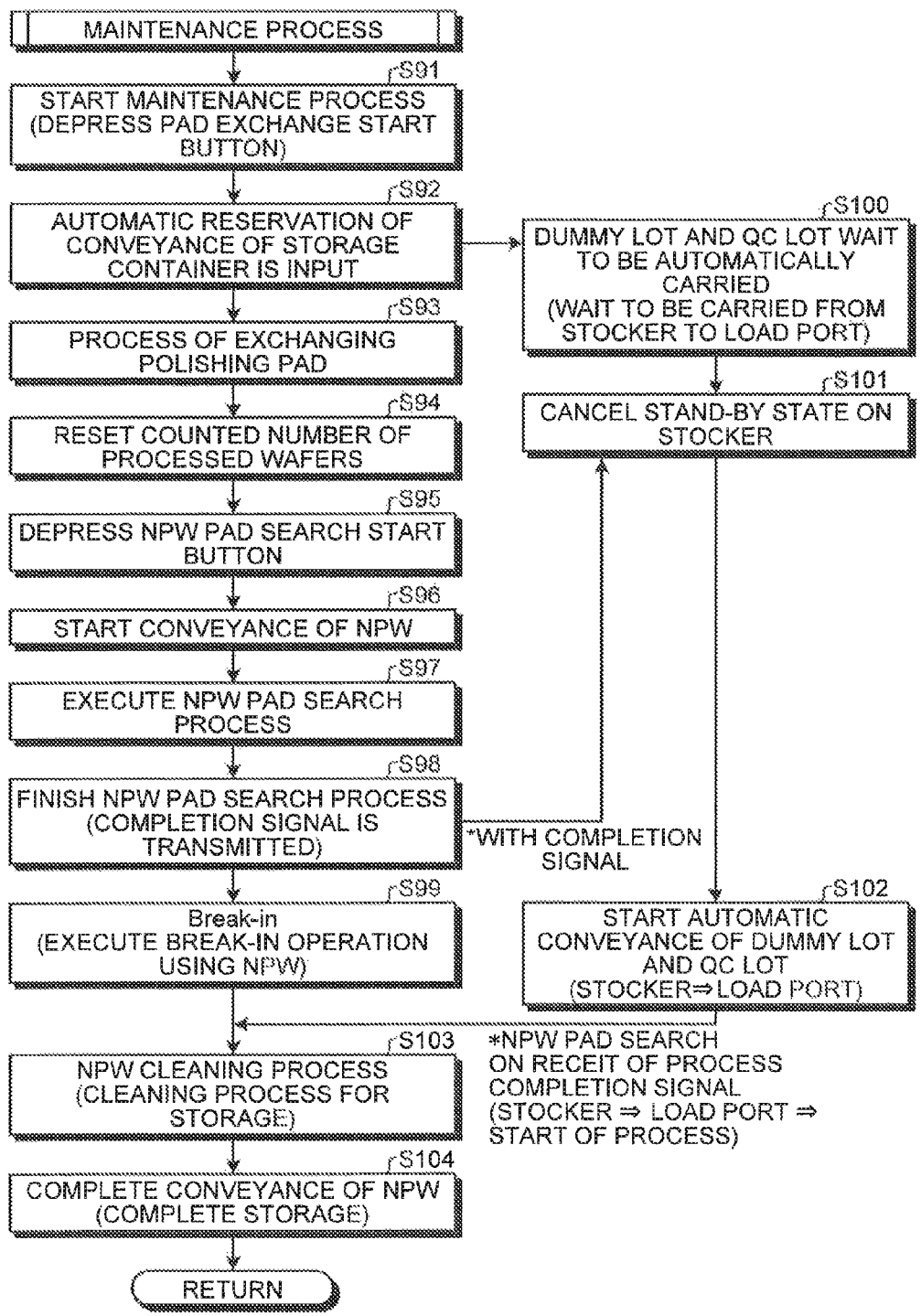
FIG. 10 is a flowchart illustrating one example of a procedure of a maintenance process according to a third embodiment.

FIG. 10 is a flowchart illustrating one example of a procedure of a maintenance process according to the third embodiment. In the maintenance process according to the third embodiment, the process executed in the CMP device 30 is the same as those in steps S71 to S79, S83, and S84 (steps S91 to S99, S103 and S104) in FIG. 9 of the second embodiment, but the procedure of carrying the dummy lot and the QC lot is different from the second embodiment. The process different from the second embodiment will be described below.

When the automatic reservation of the conveyance of the storage container is input in step S92, the dummy lot and the QC lot that are in the stand-by state on the stocker 20 are brought into the state of waiting the start of the conveyance to the load port 35 of the CMP device 30, simultaneous with the processes in steps S92 to S97 (step S100). When the pad search process in step S98 is finished, and the completion signal is output (transmitted) to the device in the system by the pad search processing unit 321 in the CMP device 30, the stand-by state of the dummy lot and the QC lot on the stocker 20 is canceled (step S101), so that the automatic conveyance of the dummy lot and the QC lot to the load port 35 of the CMP device 30 by the carrier device 50 is started (step S102). When the NPW cleaning process in step S103 and the conveyance of the NPW in step S104 are finished, the process for the dummy lot and the QC lot carried to the load port 35 is started.

The third embodiment also provides an effect same as that of the second embodiment.

In the example described above, when the pad search process using the NPW is completed in step S98, the stand-by state of the dummy lot and the QC lot on the stocker 20 is canceled (step S101), and the dummy lot and the QC lot are conveyed to the load port 35 of the CMP device 30 from the stocker 20 (step S102). However, when the NPW pad search start button is depressed in step S95, the stand-by state of the dummy lot and the QC lot on the stocker 20 may be canceled (step S101), and the dummy lot and the QC lot may be conveyed to the load port 35 of the CMP device 30 from the stocker 20 (step S102).

Fourth Embodiment

In the third embodiment, when any trouble is generated during the period from the depression of the pad search start button 331 using the NPW in step S95 to the execution of the pad search process in step S97, the dummy lot and the QC lot, which are to be automatically carried, have to be manually collected. In view of this, a fourth embodiment describes the CMP process system that does not need the operation of manually collecting the dummy lot and the QC lot, which are to be automatically carried, even in the case described above.

Figure 11:
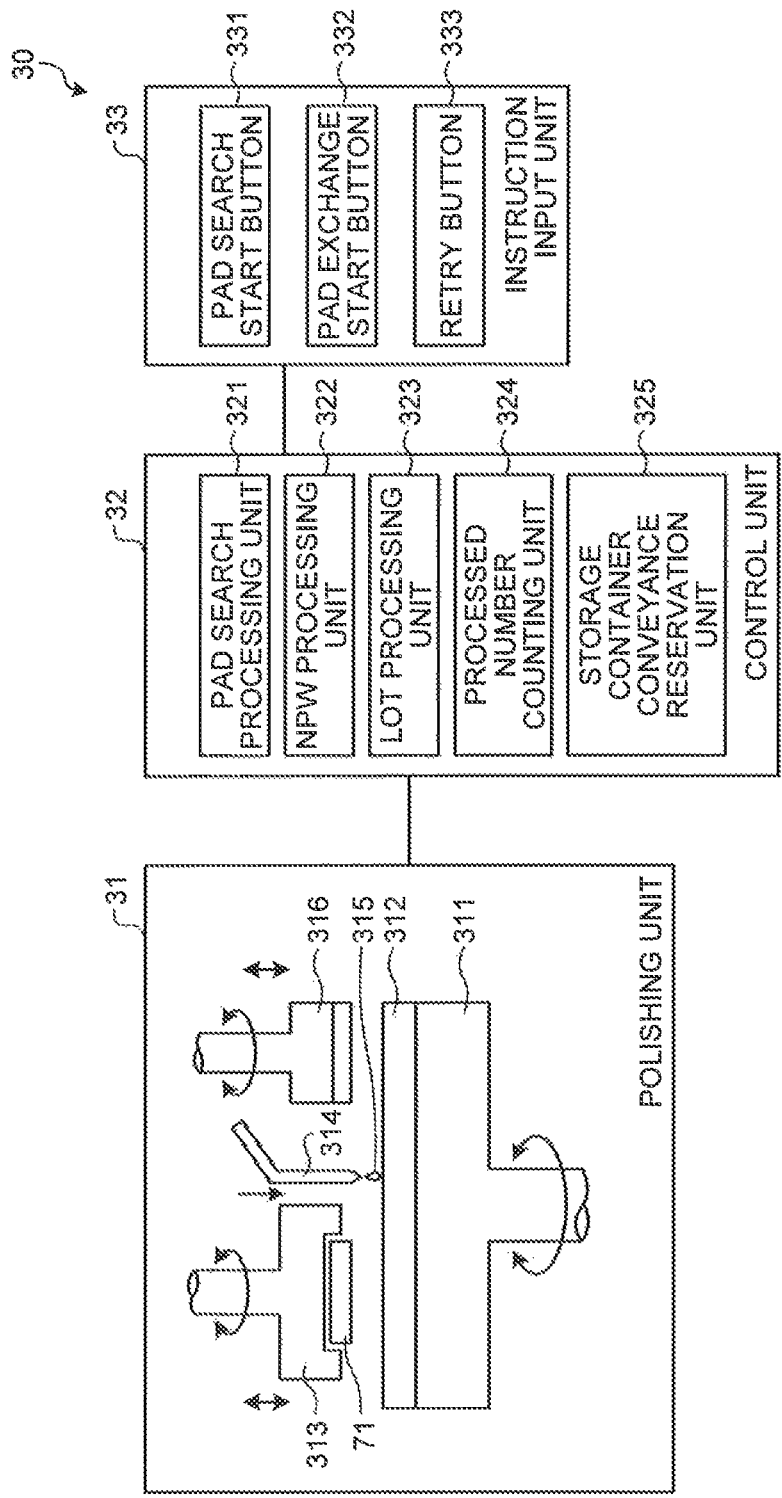
FIG. 11 is a view schematically illustrating one example of a CMP device according to a fourth embodiment.

FIG. 11 is a diagram schematically illustrating one example of the CMP device according to the fourth embodiment. The CMP device 30 further includes a retry button 333 in the instruction input unit 33 in the CMP device illustrated in FIG. 6 according to the first embodiment. The components same as those in FIGS. 2 and 6 are identified by the same numerals, and the description thereof will not be repeated.

The retry button 333 is used to again start the process of resetting the counted value of the processed number after the NPW in the CMP device 30 is collected, when any trouble is caused during the period from the depression of the pad search start button 331 using the NPW to the conveyance of the NPW.

Figure 12:
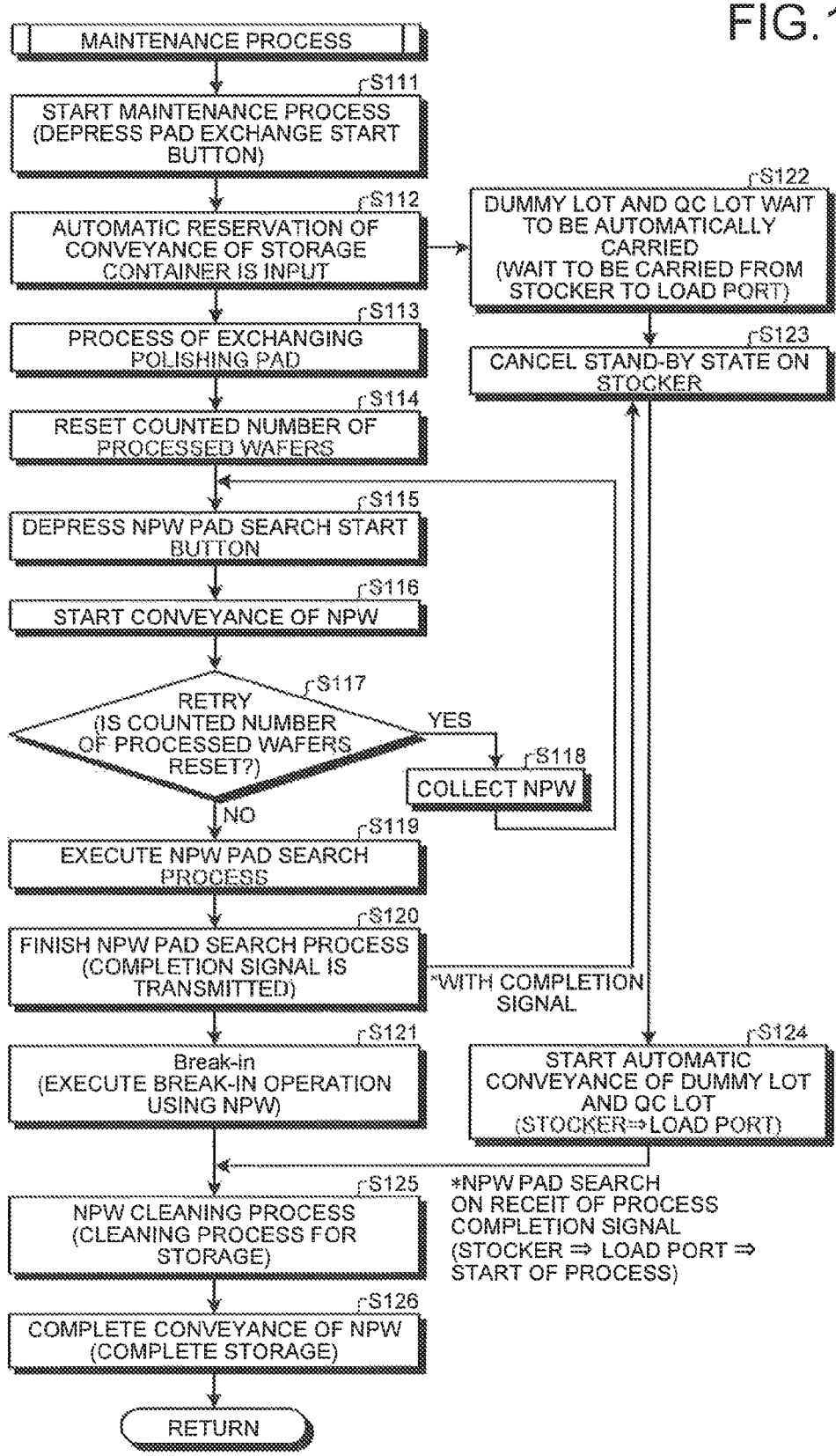
FIG. 12 is a flowchart illustrating one example of a procedure of a maintenance process according to the fourth embodiment.

FIG. 12 is a flowchart illustrating one example of a procedure of a maintenance process according to the fourth embodiment. In the maintenance process in the fourth embodiment, the maintenance process is started when the maintenance operator depresses the pad exchange start button 332 in the instruction input unit 33 in the CMP device 30 (step S111). The automatic reservation of the conveyance of the storage container is input to the storage container conveyance reservation unit 325 in the control unit 32 by the depression of the pad exchange start button 332 (step S112).

Next, the maintenance operator carries out the process of exchanging the polishing pad 312 (step S113). Thereafter, the maintenance operator resets the counted value of the processed number in the processed number counting unit 324 in the control unit 32 (step S114), and depresses the pad search start button 331 in the instruction input unit 33 (step S115). With this operation, the conveyance of the NPW to the polishing head 313 from the storage position of the NPW in the CMP device 30 is started (step S116).

Then, it is determined whether the maintenance operator depresses the retry button 334 in the instruction input unit 33 or not (step S117). When the retry button 334 is depressed since some trouble is caused till the process of carrying the NPW (Yes in step S117), the counted value of the processed number is reset, and the NPW in the CMP device 30 is collected (step S118). Then, the process returns to step S115.

On the other hand, when the retry button 334 is not depressed (No in step S117), the pad search process is executed (step S119). In the pad search process, the positioning process and the height adjustment of the polishing pad 312 by using the NPW are executed. When the pad search process is completed (step S120), the break-in operation (break-in) using the NPW is executed (step S121).

When the automatic reservation of the conveyance of the storage container is input in step S112, the dummy lot and the QC lot, which are in the stand-by state on the stocker 20, wait to start the automatic conveyance to the load port 35 of the CMP device 30 simultaneous with the processes in steps S112 to S119 (step S122). When the pad search process is finished in step S120, and a completion signal is output (transmitted) to the device in the system by the pad search processing unit 321 in the CMP device 30, the stand-by state of the dummy lot and the QC lot on the stocker 20 is canceled (step S123), and the automatic conveyance of the dummy lot and the QC lot to the load port 35 of the CMP device 30 by the carrier device 50 is started (step S124). Thereafter, the process is started for the dummy lot and the QC lot placed on the load port 35.

When the break-in operation using the NPW in step S121 is finished, the cleaning process of the NPW is executed (step S125). The cleaning process is executed in order to store the NPW on the original storage position. When the cleaning process of the NPW is finished, a process of conveying the NPW is carried out for storing the NPW on the original storage portion in the CMP device 30 (step S126), and the storage of the NPW is completed. Thus, the maintenance process is completed, and the process returns to the flowchart in FIG. 8A.

In the fourth embodiment, the retry button 333 is provided to start the process again from the depression of the pad search start button 331 in step S115 after the NPW that is currently conveyed is collected, when some trouble is caused on the CMP device 30 before the pad search process and before the completion of the carrying process of the NPW. Thus, when some trouble is caused, the measure for the portion where the trouble is caused can be taken without stopping the process illustrated in FIG. 12.

In the description above, the break-in operation using the NPW is executed, and the process of cleaning the NPW is continuously executed, after the pad search process is completed. However, the process of cleaning the NPW may be executed, and then, the break-in operation using the NPW may be executed, after the completion of the pad search process. In this case, the NPW may temporarily be stored in the original storage position after the cleaning process of the NPW, and then, the NPW may be conveyed again to the polishing head 313.

In the description above, the CMP process system has been described. However, the embodiments described above can be applied to a dry etching output using a dry etching device that etches a wafer.

In the description above, the storage container 70 having the wafer 71 prepared by the wafer preparation device 10 is temporarily arranged in the stocker 20. However, the stocker 20 may not be provided, and the storage container 70 may directly be conveyed to the load port 35 of the process device such as the CMP device 30. In this case, the storage container 70 is conveyed among the respective processing devices by use of an OHT not illustrated, and the storage container 70 waits on the OHT, not on the stocker 20.

Fifth Embodiment

In the embodiments described above, the CMP process system is used as the semiconductor manufacturing process system. However, the embodiments are also applicable to a dry etching process system. In this case, the CMP device 30 in FIG. 1 is replaced by a dry etching device. A dry etching process system using an RIE (Reactive Ion Etching) device as the dry etching device will be described below.

Figure 13:
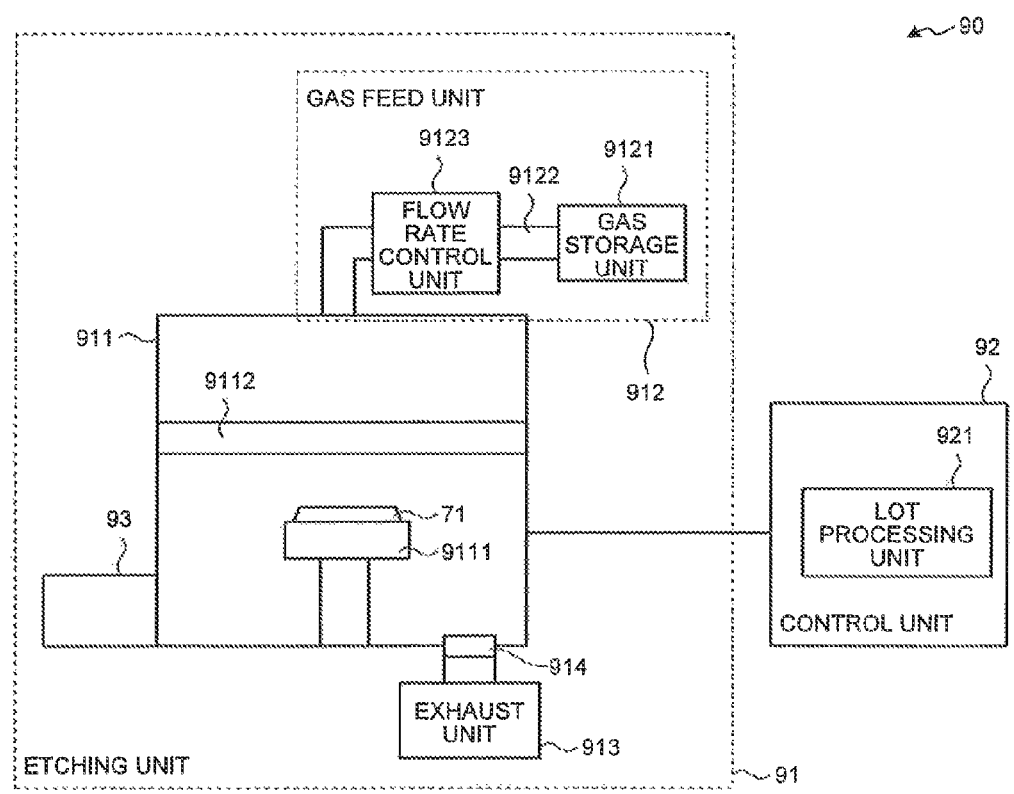
FIG. 13 is a view schematically illustrating one example of a configuration of a general RIE device.

FIG. 13 is a view schematically illustrating a configuration of a general RIE device. The RIE device 90 includes an etching unit 91 for performing an etching process to a wafer 71, and a control unit 92 that controls the process by the etching unit 91. A load port 93 on which a storage container 70 is placed is provided at the outside of the etching unit 91.

The etching unit 91 includes a chamber 911, a gas feed unit 912 for feeding gas to the chamber 911, an exhaust unit 913 having a vacuum pump that allows the gas in the chamber 911 to be exhausted, and a gate valve 914 provided between the exhaust unit 913 and the chamber 911.

The chamber 911 has its inside a stage 9111 on which the wafer 71 to be processed is placed, and the stage 9111 serves as an electrode during the etching process. The chamber 911 has its inside a shower head 9112 that is arranged to be opposite to the stage 9111, feeds the gas from the gas feed unit 912 to the stage 9111, and serves as an electrode during the etching process. For example, a radio-frequency power source, not illustrated, is connected to the stage 9111, and the shower head 9112 is grounded.

The shower head 9112 is formed with a small through-hole extending through the shower head in the thickness direction. Thus, the gas can be fed to the stage 9111 like a shower.

The gas feed unit 912 includes a gas storage unit 9121 that stores gas upon performing the etching process, a pipe 9122 that connects between the gas storage unit 9121 and the chamber 911, and a flow rate control unit 9123 mounted on the pipe 9122 for controlling the flow rate of the gas fed to the chamber 911.

The control unit 92 includes a lot processing unit 921 that extracts the wafer 71 from the storage container 70 on the load port 93, and allows the etching unit 91 to execute the etching process, during the dummy lot process, the QC lot process, and the normal lot process.

The etching process by the RIE device 90 will briefly be described. During the etching, the wafer 71 in the storage container 70 placed on the load port 93 is conveyed to the stage 9111 in the chamber 911, and the wafer 71 is held on the stage 9111 by a unit such as a vacuum chuck holder. The gate valve 914 is opened, and in this state, the chamber 911 is evacuated by the exhaust unit 913 in order that the chamber 911 has a predetermined degree of vacuum. Thereafter, the flow rate of the gas from the gas storage unit 9121 is controlled by the flow rate control unit 9123, and in this state, the gas is fed into the chamber 911. The gas fed into the chamber 911 is fed to the stage 9111 through the small through-hole formed on the shower head 9112. When a radio-frequency power is applied between the stage 9111 and the shower head 9112 in this state, plasma is generated between the stage 9111 and the shower head 9112. Due to the radio-frequency power applied to the stage 9111, the gas that is made into plasma is accelerated toward the wafer 71, so that the wafer 71 is etched.

Figure 14:
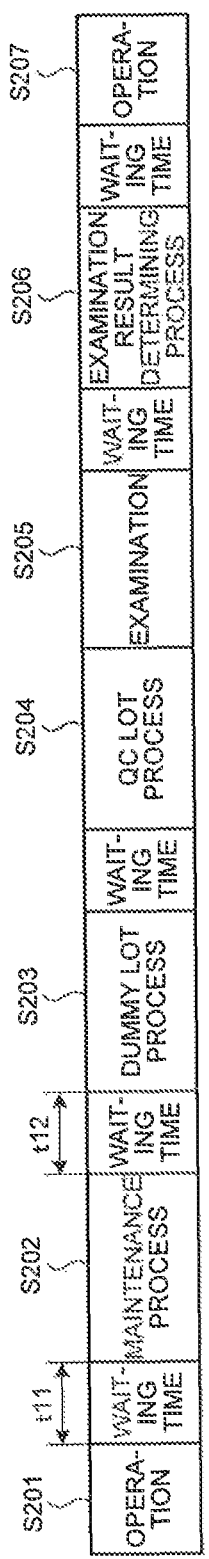
FIG. 14 is a view schematically illustrating a flow of a general maintenance process in a dry etching process system.

Since the RIE device described above uses the vacuum device (vacuum chamber), a periodical maintenance is needed, for example. FIG. 14 is a view schematically illustrating a flow of a general maintenance process in the dry etching process system. It is supposed that the RIE device 90 is in the operation state (step S201), and then, a time to carry out a periodic check (maintenance) has come (step S202). In the period for the periodic check, an operator of the RIE device 90 reports a maintenance operator that it is the time to carry out the maintenance. The maintenance operator who receives the notification goes to the place where the RIE device 90 is installed, and starts the operation. Therefore, there is a waiting period generated until the maintenance operator starts the maintenance operation after the RIE device stops.

In the maintenance process in step S202, the maintenance operator checks the ultimate pressure and the leak rate of the chamber 911, exchanges and wipes the components in the chamber 911, checks the ultimate pressure and the leak rate of the chamber 911 after the exchanging and wiping operation, and performs a calibration process of the flow rate control unit 9123.

After the maintenance process, the maintenance operator informs the operator of the RIE device 90 of the completion of the maintenance process. After receiving that the maintenance process is completed, the operator allows the RIE device 90 to execute the dummy lot process (step S203). After the dummy lot process is finished, the operator makes the RIE device 90 execute the QC lot process (step S204).

Then, the operator makes a check by using the result of the QC lot process (step S205), and creates a check result. Thereafter, the operator delivers the check result to an operator determining the check result. The operator determining the check result determines whether or not the check result satisfies the condition (standard) for operating the RIE device 90 (step S206), and returns the result to the operator. When the check result is determined to satisfy the operation condition, the RIE device 90 executes the etching process by using the normal lot (step S207).

In the general dry etching process system, a waiting time t11 is generated between the end of the operation in step S201 and the start of the maintenance process in step S202, since the operator has to give a request of the maintenance process to the maintenance operator. A waiting time t12 is also generated between the maintenance process in step S202 and the dummy lot process in step S203, since the maintenance operator gives information involved with the maintenance process to the operator of the RIE device 90.

As described above, in the maintenance process in the general dry etching process system, plural persons, such as the maintenance operator, and the operator of the RIE device 90, are involved. The waiting times t11 and t12 are generated due to the communication of the information among these persons. Specifically, wasted time is lost until the dummy lot process is executed after the RIE device 90 is stopped for the maintenance process. In view of this, a dry etching process system that can reduce the wasted time will be described in fifth and sixth embodiments.

In the dry etching process system according to the fifth embodiment, the CMP device 30 in the CMP process system in FIG. 1 is replaced by the RIE device, and the configuration of the RIE device is different from that illustrated in FIG. 13. The different point from the general dry etching process system will be described below.

Figure 15:
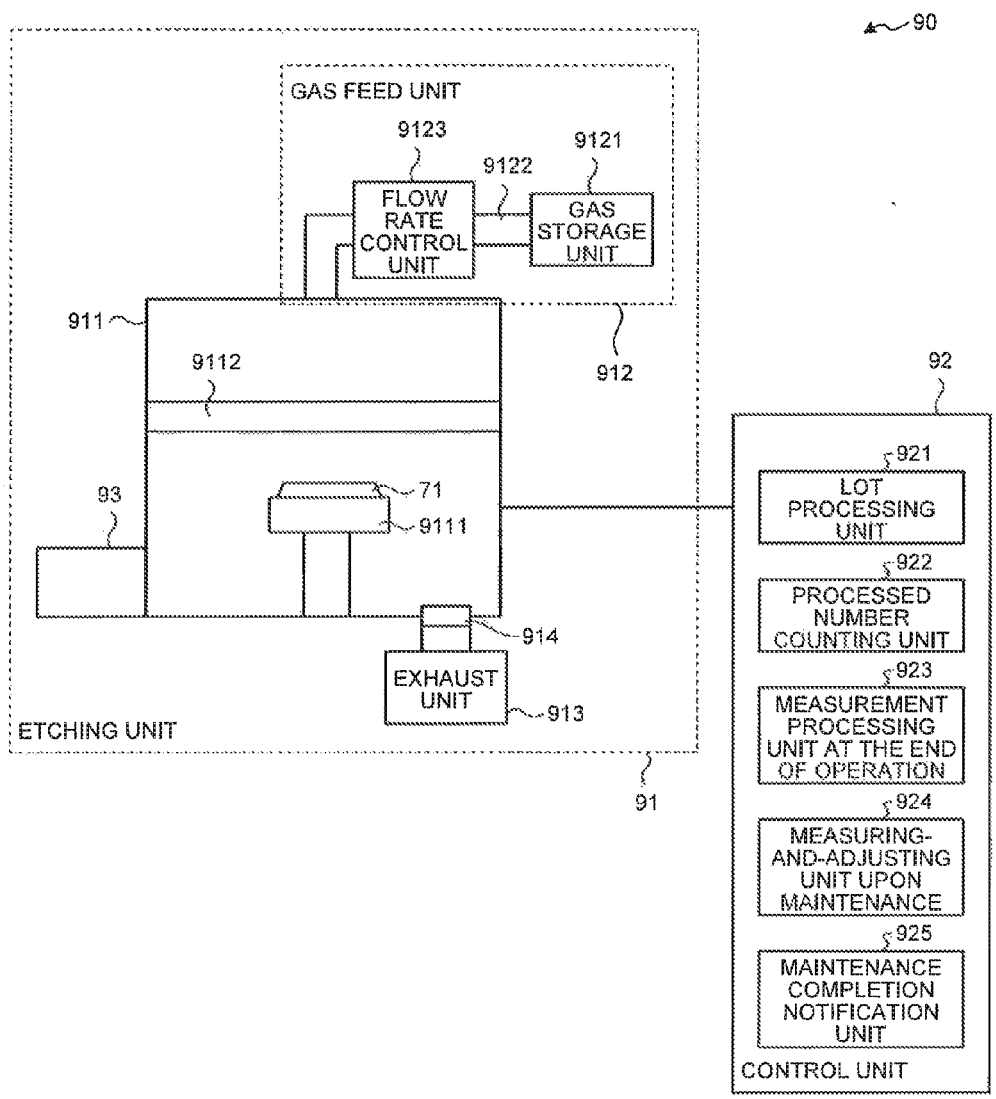
FIG. 15 is a view schematically illustrating one example of a configuration of an RIE device according to a fifth embodiment.

FIG. 15 is a view schematically illustrating a configuration of an RIE device according to the fifth embodiment. The RIE device 90 also has a processed number counting unit 922, a measurement processing unit at the end of operation 923, a measuring-and-adjusting (measuring/adjusting) unit upon maintenance 924, and a maintenance completion notification unit 925 in the control unit 92 of the RIE device in FIG. 13.

The processed number counting unit 922 counts the number of the wafers 71 that are etched after the previous maintenance process in the RIE device 90. When counting the predetermined number of the processed wafers 71, the processed number counting unit 922 gives a signal to each device in the dry etching process system. When the maintenance process is executed, the processed number counting unit 922 resets the counted number of the processed wafers 71.

When the operation of the RIE device 90 is finished, the measurement processing unit at the end of operation 923 is started by the instruction from the control device 60, for example. It measures vacuum holding state information for confirming vacuum holding state in the chamber 911, and then allows the chamber 911 to be open to the atmosphere. Examples of the vacuum holding state information include an ultimate degree of vacuum of the chamber 911, and a leak rate and so on.

After the maintenance operator exchanges and cleans the components in the chamber 911 that are open to the atmosphere, the measuring-and-adjusting unit upon maintenance 924 evacuates air from the chamber 911, and executes the process of measuring the vacuum holding state information of the chamber 911 and the calibration process of the flow control unit 9123.

After a calibration operation carried out by the maintenance operator is finished after the measurement of the vacuum holding state information of the chamber 911 and the calibration process of the flow rate control unit 9123 at the measurement/adjusting unit upon maintenance 924, the maintenance completion notification unit 925 gives a maintenance completion notification, indicating that the maintenance process is completed, to the carrier device 50.

Figure 16A:
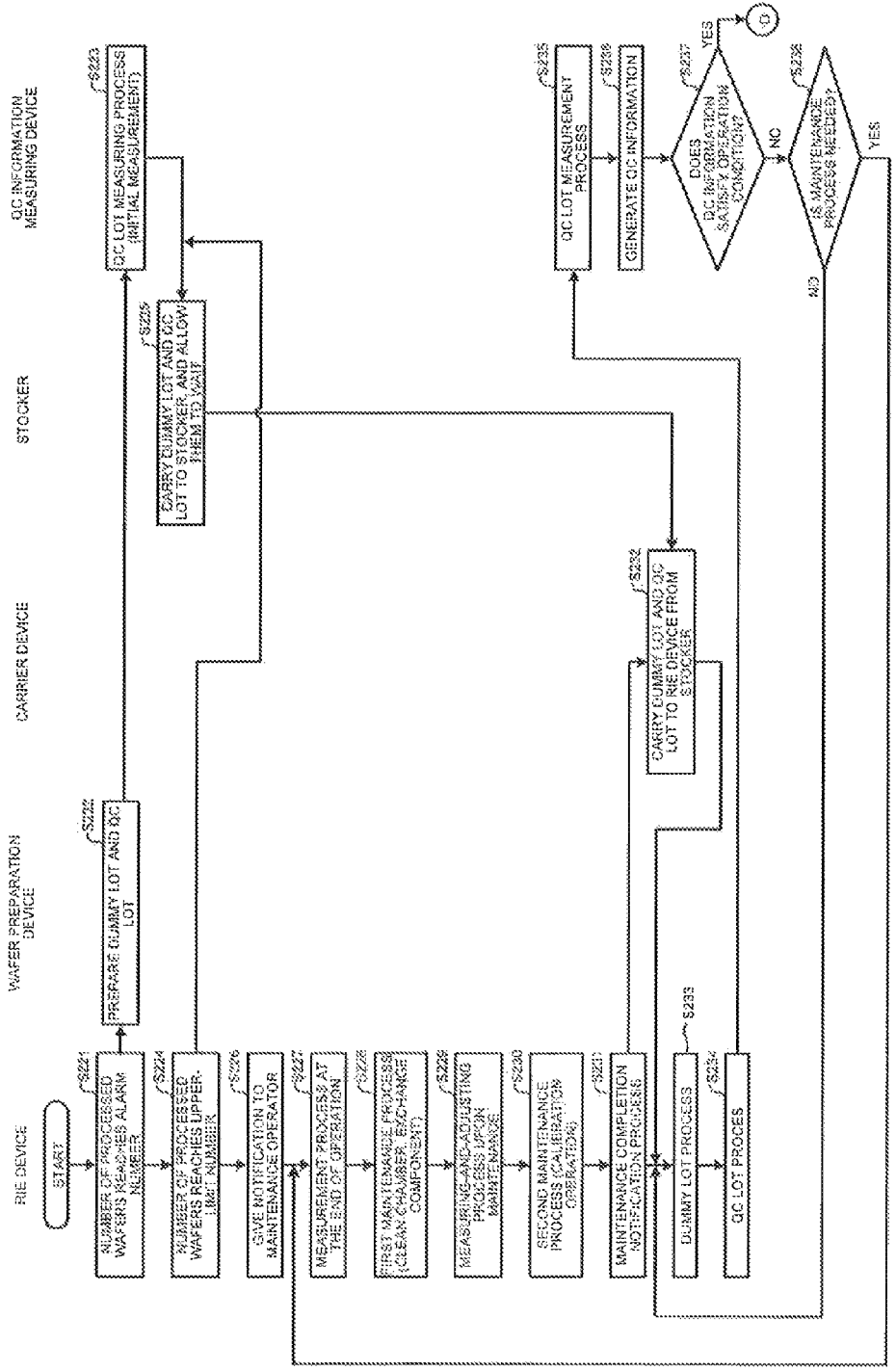

The maintenance process in the dry etching process system thus configured will be described. FIGS. 16A and 16B are flowcharts illustrating one example of a procedure of the maintenance process according to the fifth embodiment. Firstly, when the processed number counting unit 922 in the RIE device 90 counts an alarm number (first alarm number) of the processed wafers 71 that is less than an upper-limit number (second alarm number) of the processed wafers 71 by a predetermined number (e.g., by the processed number in one lot) in the RIE device 90 (step S221), the processed number counting unit 922 transmits a signal indicating that the counted number has reached the alarm number to the dry etching process system. When receiving the alarm number signal, the wafer preparation device 10 prepares the dummy lot and the QC lot (step S222). The QC information measuring device 40 performs the QC lot measuring process (initial measurement) for the QC lot (step S223).

Next, when the number of the processed wafers 71 reaches the upper-limit number in the processed number counting unit 922 in the RIE device 90 (step S224), the processed number counting unit 922 transmits a signal, indicating that the number of the processed wafers 71 has reached the upper-limit number to the dry etching process system. When receiving the upper-limit number signal, the dummy lot and the QC lot are conveyed from the wafer preparation device 10 to the stocker 20. The dummy lot and the QC lot are held in the stocker 20, so that they are in a stand-by state (step S225). When receiving the upper-limit signal, the control device 60 notifies the maintenance operator of the situation that the time to carry out the maintenance process of the RIE device 90 has come (step S226). This notification is given to the maintenance operator by sending an e-mail to a mobile information terminal of the maintenance operator or allowing the mobile information terminal to sound. The control device 60 also issues an instruction to execute the maintenance process to the RIE device 90.

When the RIE device 90 receives the instruction to execute the maintenance process, the measurement processing unit at the end of operation 923 in the control unit 92 executes a measurement process at the end of the operation (step S227). The measurement process at the end of the operation is the process of measuring predetermined processing items including the ultimate degree of vacuum and the leak rate of the chamber 911. After the measurement of the vacuum holding state information is finished, nitrogen gas is flown into the chamber 911, so that the chamber 911 is open to the atmosphere.

Then, the maintenance operator carries out a first maintenance process of the RIE device 90 (step S228). In the first maintenance process, the chamber 911 and the components in the chamber 911 are cleaned, and the components in the chamber 911 are exchanged.

After the first maintenance process is finished, the measuring-and-adjusting unit upon maintenance 924 in the control unit 92 performs the measuring-and-adjusting process upon the maintenance (step S229). The measuring-and-adjusting process upon the maintenance includes the process of measuring the vacuum holding state information containing the ultimate degree of vacuum and the leak rate of the chamber 911, and the process of adjusting predetermined processing items including the calibration process of the flow rate control unit 9123, after the chamber 911 to which the first maintenance process is carried out is evacuated.

Then, the maintenance operator carries out a second maintenance process of the RIE device 90 (step S230). The calibration operation of each component in the RIE device 90 is carried out as the second maintenance process.

After the second maintenance process is completed, the maintenance completion notification unit 925 in the control unit 92 sends the maintenance completion notification, indicating that the maintenance process is ended, to the carrier device 50 (step S231). This notification is given to the maintenance operator by sending an e-mail to a mobile information terminal of the maintenance operator or allowing the mobile information terminal to sound. When receiving the maintenance completion notification, the carrier device 50 carries the dummy lot and the QC lot, which are in the stand-by state on the stocker 20, to the RIE device 90 (step S232).

Thereafter, the dummy lot process is executed by using the dummy lot conveyed to the load port 93 of the RIE device 90 (step S233), and then, the QC lot process is executed by using the QC lot conveyed to the load port 93 of the RIE device 90 (step S234).

Then, the QC lot measurement process using the QC information measuring wafer is performed by the foreign-matter counting unit 41 and the thickness measuring unit 42 in the QC information measuring device 40 (step S235), and the examination result acquiring unit 43 calculates the examination result from the measurement result by the foreign-matter counting unit 41 and the thickness measuring unit 42, so as to generate the QC information (step S236).

Thereafter, the determining unit 45 determines whether the QC information (examination result) satisfies the operation condition of the RIE device 90 or not (step S237). When the QC information does not satisfy the operation condition (No in step S237), the determining unit 45 also determines whether the maintenance process is again needed or not (step S238). When the maintenance process is not needed (No in step S238), the process returns to step S233. When the maintenance process is needed (Yes in step S238), the process returns to step S227.

When the QC information satisfies the operation condition in step S237 (Yes in step S237), the determining unit 45 determines that the RIE device 90 can be operated (step S239), and issues an instruction of preparing the normal lot to the wafer preparation device 10. Thereafter, the wafer preparation device 10 generates the normal lot (step S240), and the storage container of the normal lot is conveyed to the stocker 20 (step S241). The carrier device 50 carries the storage container of the normal lot to the RIE device 90 from the stocker 20 (step S242). Then, the RIE device 90 performs the normal lot process (step S243), and the process is ended. Thus, the maintenance process of the RIE device 90 is completed.

In the fifth embodiment, just after the processed number of the RIE device 90 reaches the upper limit value, the measurement processing unit at the end of operation 923 executes the measurement process at the end of the operation, which is a part of the maintenance process, according to the instruction from the control device 60. Accordingly, this embodiment brings an effect of being capable of reducing the time taken for the maintenance, compared to the conventional case in which the measurement process at the end of the operation is executed after the operator arrives at the place where the RIE device 90 is installed after the processed number reaches the upper limit value.

The measuring-and-adjusting unit upon maintenance 924 executes the measuring-and-adjusting process upon the maintenance, just after the chamber 911 that is open to the atmosphere is cleaned and the components are exchanged. Therefore, the process that is manually executed in the conventional case is automatically executed, whereby the time taken for the maintenance process can be shortened.

After the calibration process of the RIE device 90 is completed, the maintenance completion notification unit 925 issues the maintenance completion notification, and the dummy lot and the QC lot, which wait on the stocker 20, are conveyed to the RIE device 90 by using the notification as a trigger. Therefore, the dummy lot process and the QC lot process can be started earlier, compared to the conventional case where the maintenance operator sends the notification of the completion of the maintenance process to the operator after the end of the maintenance process, and then, the dummy lot and the QC lot are prepared.

Sixth Embodiment

In the fifth embodiment, the maintenance process of the RIE device is carried out when the number of the processed wafers reaches the predetermined number. In the sixth embodiment, the maintenance process of the RIE device is periodically executed.

Figure 17:
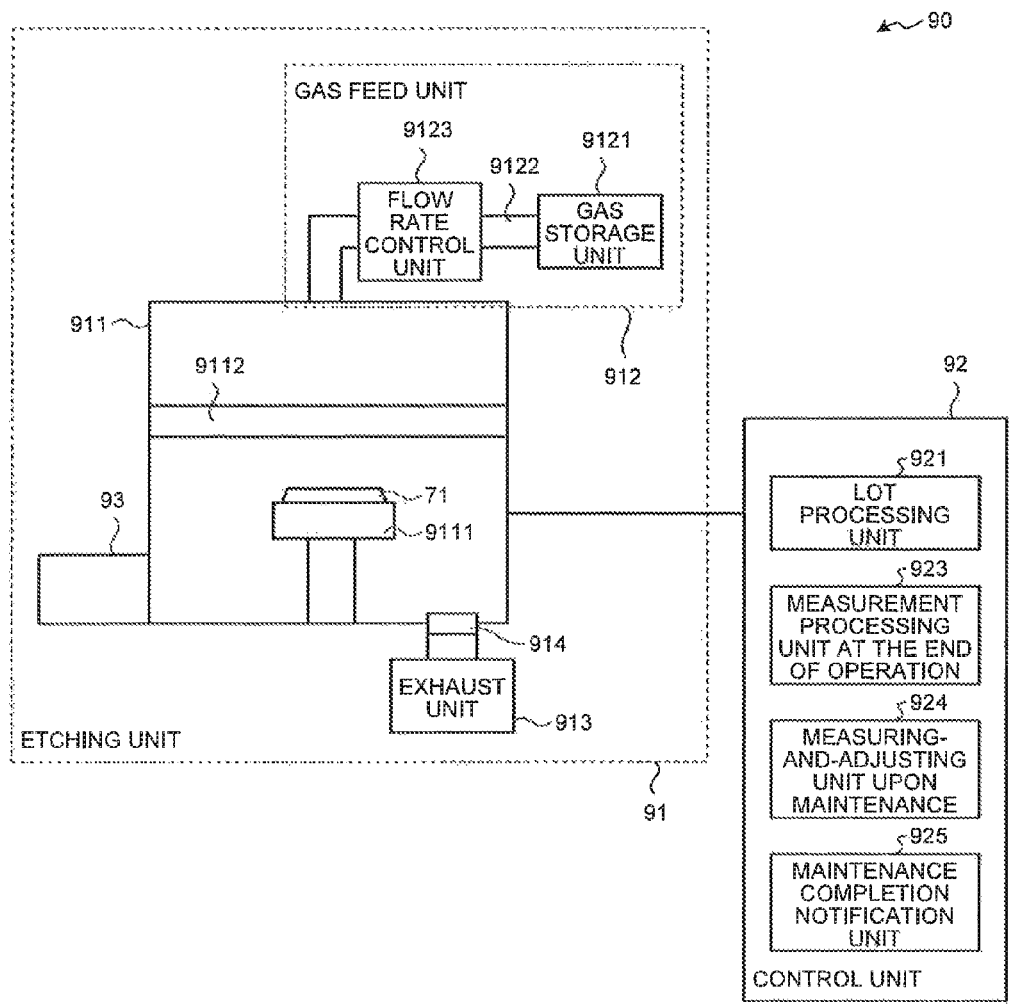
FIG. 17 is a view schematically illustrating a configuration of an RIE device according to a sixth embodiment.

FIG. 17 is a view schematically illustrating one example of a configuration of an RIE device according to the sixth embodiment. The RIE device 90 does not have the processed number counting unit 922 in the control unit 92 in the RIE device illustrated in FIG. 15. The measurement processing unit at the end of operation 923 executes the process of measuring the vacuum holding state information of the chamber 911, and then, allows the chamber 911 to be open to the atmosphere, after the operation of the RIE device 90 is stopped, and the instruction to execute the maintenance process is received from the control device 60. The measurement processing unit at the end of operation 923 also notifies the other devices, including the wafer preparation device 10, of the completion of the measurement process at the end of the operation. The other configuration is the same as that in FIGS. 13 and 15, and the description will not be repeated.

Figure 18A:
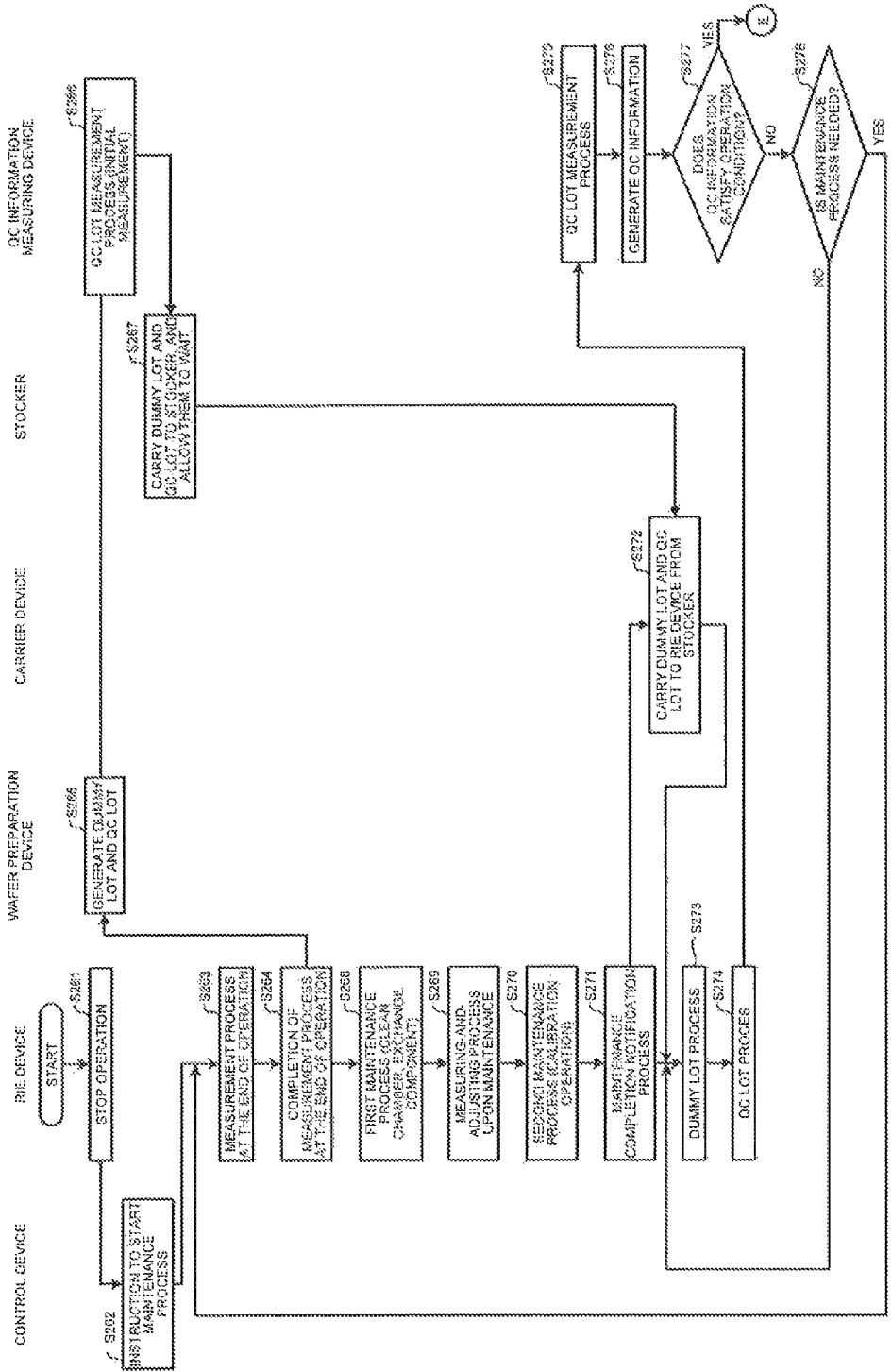

The maintenance process in the dry etching process system thus configured will be described. FIGS. 18A and 18B are flowcharts illustrating one example of the procedure of the maintenance process according to the sixth embodiment. After a predetermined period (e.g., one week, or ten days) has elapsed after the start of the operation of the RIE device 90, the RIE device 90 stops the operation (step S261). Then, the control device 60 gives an instruction to execute the maintenance process to the RIE device 90 (step S262). When receiving the instruction to execute the maintenance process, the measurement processing unit at the end of operation 923 of the RIE device 90 executes the measurement process at the end of the operation as in step S227 in FIG. 16A (step S263).

When finishing the measurement process at the end of the operation, the measurement processing unit at the end of operation 923 transmits the notification of the completion of the measurement process at the end of the operation to the wafer preparation device 10 (step S264).

When receiving the notification of the completion of the measurement process at the end of the operation, the wafer preparation device 10 prepares the dummy lot and the QC lot (step S265). The QC information measuring device 40 performs the QC lot measuring process (initial measurement) for the QC lot (step S266). Thereafter, the dummy lot and the QC lot are conveyed to the stocker 20 from the wafer preparation device 10, and the stocker 20 holds the dummy lot and the QC lot, and becomes in the stand-by state (step S267).

On the other hand, in the RIE device 90, after the measurement process at the end of the operation is completed, the maintenance operator carries out the first maintenance process of the RIE device 90 as in step S228 in FIG. 16A (step S268). After the first maintenance process is completed, the measuring-and-adjusting unit upon maintenance 924 in the control unit 92 executes the measuring-and-adjusting process upon the maintenance as in step S229 in FIG. 16A (step S269). Then, the maintenance operator carries out the second maintenance process of the RIE device 90 as in step S230 in FIG. 16A (step S270).

After the second maintenance process is completed, the maintenance completion notification unit 925 in the control unit 92 transmits the maintenance completion notification, indicating that the maintenance process is completed, to the carrier device 50 (step S271). This notification is given to the maintenance operator by sending an e-mail to a mobile information terminal of the maintenance operator or allowing the mobile information terminal to sound. When receiving the maintenance completion notification, the carrier device 50 conveys the dummy lot and the QC lot, which are in the stand-by state on the stocker 20, to the RIE device 90 (step S272).

Thereafter, the dummy lot process and the QC lot process are continuously executed, and it is determined whether the QC information satisfies the operation condition or not, as described in step S233 and the following steps in FIGS. 16A and 16B according to the fifth embodiment. When the QC information satisfies the operation condition, the process moves to the normal lot process (steps S273 to S283).

The sixth embodiment can also bring the effect same as the fifth embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor manufacturing process system comprising:
   a storage container configured to store wafers in a predetermined number;
   a wafer processing device configured to eject a wafer from the storage container placed on a port, and perform a predetermined process to the wafer;

a QC information measuring device configured to measure QC information that is a parameter indicating a process quality in the wafer processing device;

a wafer preparation device configured to prepare the wafer, which is to be supplied to the wafer processing device, in the storage container; and a carrier device configured to carry the storage container among the respective devices, wherein the operation of each device is controlled in accordance with a recipe, the wafer processing device comprises:
- a processed number counting unit configured to add and count a number of processed wafers; and
- a maintenance post-processing unit configured to execute a dummy lot process using a dummy lot that includes a wafer for a dummy running into the storage container, and a QC lot process using a QC lot that includes a wafer for measuring the QC information, after a maintenance process in the wafer processing device is completed, the wafer preparation device prepares the dummy lot and the QC lot, when a first number of the processed wafers is counted by the processed number counting unit in the wafer processing device, and the carrier device allows the dummy lot and the QC lot, prepared by the wafer preparation device, to wait at a predetermined position, when a second number of processed wafers, which is more than the first number of processed wafers, is counted by the processed number counting unit, and carries the dummy lot and the QC lot to the port of the wafer processing device, simultaneous with the maintenance process, before the maintenance process is completed.

2. The semiconductor manufacturing process system according to claim 1, wherein the maintenance post-processing unit continuously executes the dummy lot process and the QC lot process.

3. The semiconductor manufacturing process system according to claim 1, wherein
the QC information measuring device includes:
- a measuring unit configured to measure the QC information by using the wafer in the QC lot that has not yet been processed and the wafer in the QC lot that has already been processed by the maintenance post-processing unit in the wafer processing device; and
- a determining unit configured to determine whether the wafer processing device can be operated or not by using the measurement result of the QC information, and the wafer processing device continuously executes the dummy lot process and the QC lot process after the maintenance process is completed, and executes a normal lot process after the QC lot process, when the measurement result by the QC information measuring device indicates that the wafer processing device can be operated.

4. The semiconductor manufacturing process system according to claim 1, wherein the first number of the processed wafers is a first alarm number indicating that the maintenance process in the wafer processing device is executed after a predetermined number of wafers is processed, and the second number of processed wafers is a second alarm number that is an upper-limit value of the processed number in the wafer processing device.

5. The semiconductor manufacturing process system according to claim 4, wherein the carrier device carries the dummy lot and the QC lot to a stocker, which temporarily stores the storage container, as the predetermined position, when the second alarm number is counted.

6. The semiconductor manufacturing process system according to claim 5, wherein
the wafer processing device further includes a first button that is used to carry the dummy lot and the QC lot, which wait on the stocker, to the wafer processing device, and the carrier device starts the conveyance of the dummy lot and the QC lot to the wafer processing device from the stocker, when the first button in the wafer processing device is depressed, to finish the conveyance of the dummy lot and the QC lot before the completion of the maintenance process.

7. The semiconductor manufacturing process system according to claim 5, wherein
the wafer processing device further includes an initialization unit configured to perform initialization of the wafer processing device by using a non-product wafer during the maintenance process, and the carrier device starts the conveyance of the dummy lot and the QC lot to the wafer processing device from the stocker, when the initialization unit in the wafer processing device outputs an initialization completion signal.

8. The semiconductor manufacturing process system according to claim 3, wherein the measuring unit in the QC information measuring device counts a number of foreign matters on the wafer in the QC lot as the QC information.

9. The semiconductor manufacturing process system according to claim 3, wherein the measuring unit in the QC information measuring device measures a thickness of a film formed on the wafer in the QC lot as the QC information.

10. The semiconductor manufacturing process system according to claim 1, wherein
the wafer processing device includes:
- a chamber;
- a flow rate control unit configured to control a flow rate of gas fed into the chamber;
- an exhaust unit configured to evacuate gas in the chamber to allow the chamber to have a predetermined degree of vacuum;
- a measurement processing unit at end of operation configured to measure vacuum holding state information to check a vacuum holding state of the chamber, and to allow the chamber to be open to the atmosphere, when receiving an instruction to execute a maintenance process of the wafer processing device;
- a measuring-and-adjusting unit upon maintenance configured to measure the vacuum holding state information of the chamber, and to execute a calibration process of the flow rate control unit, after a process including a process of exchanging or cleaning a component in the chamber that is open to the atmosphere is completed; and
- a maintenance completion notification unit configured to output a maintenance completion notification after a calibration process of a member composing the wafer processing device is completed, and the carrier device conveys the dummy lot and the QC lot, which wait on the predetermined position, to the port of the wafer processing device, when receiving the maintenance completion notification.

11. A semiconductor manufacturing process system comprising:
a storage container configured to store wafers in a predetermined number;

a wafer processing device configured to eject a wafer from the storage container placed on a port, and perform a predetermined process to the wafer;

a QC information measuring device configured to measure QC information that is a parameter indicating a process quality in the wafer processing device;

a wafer preparation device configured to prepare the wafer, which is to be fed to the wafer processing device, in the storage container; and a carrier device configured to carry the storage container among the respective devices, wherein the operation of each device is controlled in accordance with a recipe, the wafer processing device comprises:
- a chamber;
- a flow rate control unit configured to control a flow rate of gas fed into the chamber;
- an exhaust unit configured to evacuate gas in the chamber to allow the chamber to have a predetermined degree of vacuum;
- a measurement processing unit at end of operation configured to measure vacuum holding state information to check a vacuum holding state of the chamber, to allow the chamber to be open to the atmosphere, and to transmit a notification of the completion of a measurement process at the end of the operation, when receiving an instruction to execute a maintenance process of the wafer processing device;
- a measuring-and-adjusting unit upon maintenance configured to measure the vacuum holding state information of the chamber, and to execute a calibration process of the flow rate control unit, after a process including a process of exchanging or cleaning a component in the chamber that is open to the atmosphere is completed;
- a maintenance completion notification unit configured to output a maintenance completion notification after a calibration process of a member composing the wafer processing device is completed; and
- a maintenance post-processing unit configured to execute a dummy lot process using a dummy lot that includes a wafer of a dummy running into the storage container, and a QC lot process using a QC lot that includes a wafer of measuring the QC information, after the maintenance process in the wafer processing device is completed, the wafer preparation device prepares the dummy lot and the QC lot, when receiving the notification of the completion of the measurement process at the end of the operation from the wafer processing device, and the carrier device allows the dummy lot and the QC lot, prepared by the wafer preparation device, to wait at a predetermined position, after receiving the notification of the completion of the measurement process at the end of the operation, and carries the dummy lot and the QC lot to the port of the wafer processing device from the predetermined position after receiving the maintenance completion notification.

12. A semiconductor manufacturing process method in a semiconductor manufacturing process system that includes:
- a storage container configured to store wafers in a predetermined number;
- a wafer processing device configured to eject the wafer from the storage container placed on a port, and perform a predetermined process to the wafer;
- a QC information measuring device configured to measure QC information that is a parameter indicating a process quality in the wafer processing device;
- a wafer preparation device configured to prepare the wafer, which is to be supplied to the wafer processing device, in the storage container; and
- a carrier device configured to carry the storage container among the respective devices, the method comprising:

preparing, in the wafer preparation device, a dummy lot having a wafer for a dummy running into the storage container, and a QC lot having a wafer for measuring QC information, when the number of processed wafers in the wafer processing device reaches a first processed number, executing a maintenance process in the wafer processing device, when the number of processed wafers in the wafer processing device reaches a second processed number larger than the first processed number, carrying, by the carrier device, the dummy lot and the QC lot to a predetermined position and allowing them to wait, when the number of processed wafers in the wafer processing device reaches the second processed number, and carrying, by the carrier device, the dummy lot and the QC lot to the port in the wafer processing device simultaneous with the maintenance process, before the maintenance process is completed, executing, in the wafer processing device, a dummy lot process using the dummy lot just after the completion of the maintenance process, and executing, in the wafer processing device, a QC lot process using the QC lot after the dummy lot process.

13. The semiconductor manufacturing process method according to claim 12, wherein the dummy lot process and the QC lot process are continuously executed.

14. The semiconductor manufacturing process method according to claim 12, further comprising:
measuring, in the QC information measuring device, QC information, which becomes a basis for determining whether the wafer processing device can be operated or not, by using the QC lot before and after the QC lot process;

determining, in the QC information measuring device, whether the wafer processing device can be operated or not by using the QC information; and executing a normal lot process after the determination when it is determined that the wafer processing device can be operated.

15. The semiconductor manufacturing process method according to claim 12, wherein the first processed number is a first alarm number indicating that the maintenance process in the wafer processing device is executed after a predetermined number of wafers is processed, and the second processed number is a second alarm number that is an upper-limit value of the processed number in the wafer processing device.

16. The semiconductor manufacturing process method according to claim 15, wherein in the carrying the dummy lot and the QC lot, the dummy lot and the QC lot are conveyed to a stocker, which is arranged near the wafer processing device for temporarily storing the storage container, as the predetermined position, and wait, when the number of processed wafers reaches the second alarm number.

17. The semiconductor manufacturing process method according to claim 12, wherein the maintenance process includes:
exchanging a component in the wafer processing device;
initializing the wafer processing device by using a non-product wafer, after the exchange of the component;

cleaning the non-product wafer; and
executing a dummy running process using the non-product wafer, wherein
in the carrying the dummy lot and the QC lot, the conveyance of the dummy lot and the QC lot to the wafer processing device from a stocker is started before the exchange of the component.

18. The semiconductor manufacturing process method according to claim 12, wherein the maintenance process includes:
exchanging a component in the wafer processing device;
initializing the wafer processing device by using a non-product wafer, after the exchange of the component;
executing a dummy running process by using the non-product wafer; and
cleaning the non-product wafer, wherein
in the carrying the dummy lot and the QC lot, the conveyance of the dummy lot and the QC lot to the wafer processing device from a stocker is started, when an initialization completion signal is output from the wafer processing device upon the completion of the initialization.

19. The semiconductor manufacturing process method according to claim 18, wherein the initializing the wafer processing device includes:
resetting the number of processed wafers;
carrying the non-product wafer to a processing position from a storage position in the wafer processing device; and
performing the initialization by using the non-product wafer, wherein
the process from the resetting to the carrying of the non-product wafer is repeatedly executed, when some trouble is caused in the wafer processing device.

20. The semiconductor manufacturing process method according to claim 12, wherein the wafer processing device includes:
a chamber;
a flow rate control unit configured to control a flow rate of gas fed into the chamber; and
an exhaust unit configured to evacuate gas in the chamber to allow the chamber to have a predetermined degree of vacuum, and
the executing the maintenance process in the wafer processing device includes:
measuring vacuum holding state information to check a vacuum holding state of the chamber, when an instruction to execute the maintenance process of the wafer processing device is received;
allowing the chamber to be open to the atmosphere;
measuring an ultimate degree of vacuum and a vacuum state in the chamber, after a process including a process of exchanging or cleaning a component in the chamber that is open to the atmosphere is completed;
executing a calibration process of the flow rate control unit; and
outputting a maintenance completion notification, after a calibration process of a member composing the wafer preparation device is completed; and
in the carrying the dummy lot and the QC lot, the carrier device carries the dummy lot and the QC lot, which wait on the predetermined position, to the port of the wafer processing device, after the carrier device receives the maintenance completion notification.

\* \* \* \* \*